(12) United States Patent
Lee et al.

(10) Patent No.: US 12,111,533 B2
(45) Date of Patent: Oct. 8, 2024

(54) LIGHT ROUTE CONTROL MEMBER AND DISPLAY DEVICE HAVING THE SAME

(71) Applicant: LG INNOTEK CO., LTD., Seoul (KR)

(72) Inventors: In Hae Lee, Seoul (KR); Young Ju Han, Seoul (KR); Byung Sook Kim, Seoul (KR); Kweon Jin Lee, Seoul (KR); Jun Sik Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/754,762

(22) PCT Filed: Sep. 22, 2020

(86) PCT No.: PCT/KR2020/012756
§ 371 (c)(1),
(2) Date: Apr. 11, 2022

(87) PCT Pub. No.: WO2021/071134
PCT Pub. Date: Apr. 15, 2021

(65) Prior Publication Data
US 2024/0085736 A1 Mar. 14, 2024

(30) Foreign Application Priority Data

Oct. 11, 2019 (KR) .................. 10-2019-0125972
Dec. 24, 2019 (KR) .................. 10-2019-0174152

(51) Int. Cl.
*G02F 1/1335* (2006.01)
*G02F 1/1681* (2019.01)
*H10K 59/80* (2023.01)

(52) U.S. Cl.
CPC .. *G02F 1/133524* (2013.01); *G02F 1/133512* (2013.01); *G02F 1/133514* (2013.01); *G02F 1/1681* (2019.01); *H10K 59/8791* (2023.02)

(58) Field of Classification Search
CPC .................................. G02F 1/133524
See application file for complete search history.

(56) References Cited

U.S. PATENT DOCUMENTS 7,715,089 B2    5/2010  Song
10,663,630 B2 *  5/2020  Larsen ............... G02B 5/00
(Continued)

FOREIGN PATENT DOCUMENTS

CN    105425501 A    3/2016
CN    107621722 A    1/2018
(Continued)

OTHER PUBLICATIONS

International Search Report dated Jan. 11, 2021 in International Application No. PCT/KR2020/012756.
(Continued)

*Primary Examiner* — Edmond C Lau
(74) *Attorney, Agent, or Firm* — Saliwanchik, Lloyd & Eisenschenk

(57) ABSTRACT

An optical path control member according to an embodiment comprises: a first substrate; a first electrode arranged on the upper surface of the first substrate; a second substrate arranged on top of the first substrate; a second electrode arranged on the lower surface of the second substrate; and an optical conversion unit which is arranged between the first electrode and the second electrode and which defines a first direction and a second direction, wherein the optical conversion unit comprises a partition part and an accommodation part that are alternately arranged in the first direction, the accommodation part includes a plurality of cells arranged to be spaced in the second direction, at least one of the cells includes a first inner side surface and a second inner side surface that are connected to each other, and the first inner side surface and/or the second inner side surface (Continued)

extends in a direction other than the first and second directions.

20 Claims, 15 Drawing Sheets

(56) References Cited

U.S. PATENT DOCUMENTS

| | | | |
|---|---|---|---|
| 10,739,663 B2 | 8/2020 | Wang et al. | |
| 10,852,572 B2 | 12/2020 | Nishimura et al. | |
| 11,016,599 B2 | 5/2021 | Ito | |
| 11,397,366 B2 | 7/2022 | Lin et al. | |
| 11,656,526 B2 | 5/2023 | Lin et al. | |
| 2008/0136990 A1 | 6/2008 | Kimura | |
| 2012/0293857 A1 | 11/2012 | Kwon et al. | |
| 2013/0264728 A1 | 10/2013 | Myoung et al. | |
| 2019/0094576 A1 | 3/2019 | Wang et al. | |
| 2019/0102007 A1 | 4/2019 | Ito | |
| 2019/0162990 A1 | 5/2019 | Nishimura et al. | |
| 2020/0050075 A1* | 2/2020 | Lin | G02F 1/29 |
| 2022/0317541 A1 | 10/2022 | Lin et al. | |

FOREIGN PATENT DOCUMENTS

| | | |
|---|---|---|
| CN | 109946889 A | 6/2019 |
| JP | 2008-139518 A | 6/2008 |
| JP | 2019-67068 A | 4/2019 |
| JP | 2021-532414 A | 11/2021 |
| KR | 10-2008-0015239 A | 2/2008 |
| KR | 10-2012-0089520 A | 8/2012 |
| KR | 10-2012-0125808 A | 11/2012 |
| KR | 10-2012-0131611 A | 12/2012 |
| KR | 10-2013-0020483 A | 2/2013 |
| KR | 10-2015-0125051 A | 11/2015 |
| KR | 10-2015-0126515 A | 11/2015 |
| KR | 10-2017-0023165 A | 3/2017 |
| KR | 10-2018-0004879 A | 1/2018 |
| KR | 10-2019-0048578 A | 5/2019 |
| KR | 10-2019-0050136 A | 5/2019 |
| KR | 10-2019-0054484 A | 5/2019 |

OTHER PUBLICATIONS

Office Action dated Mar. 30, 2023 in Chinese Application No. 202080071420.2.
Office Action dated Apr. 18, 2023 in Japanese Application No. 2022-521512.
Supplementary European Search Report dated Sep. 27, 2023 in European Application No. 20873853.4.
Office Action dated Jun. 18, 2024 in Korean Application No. 10-2019-0125972.

* cited by examiner

Fig. 15
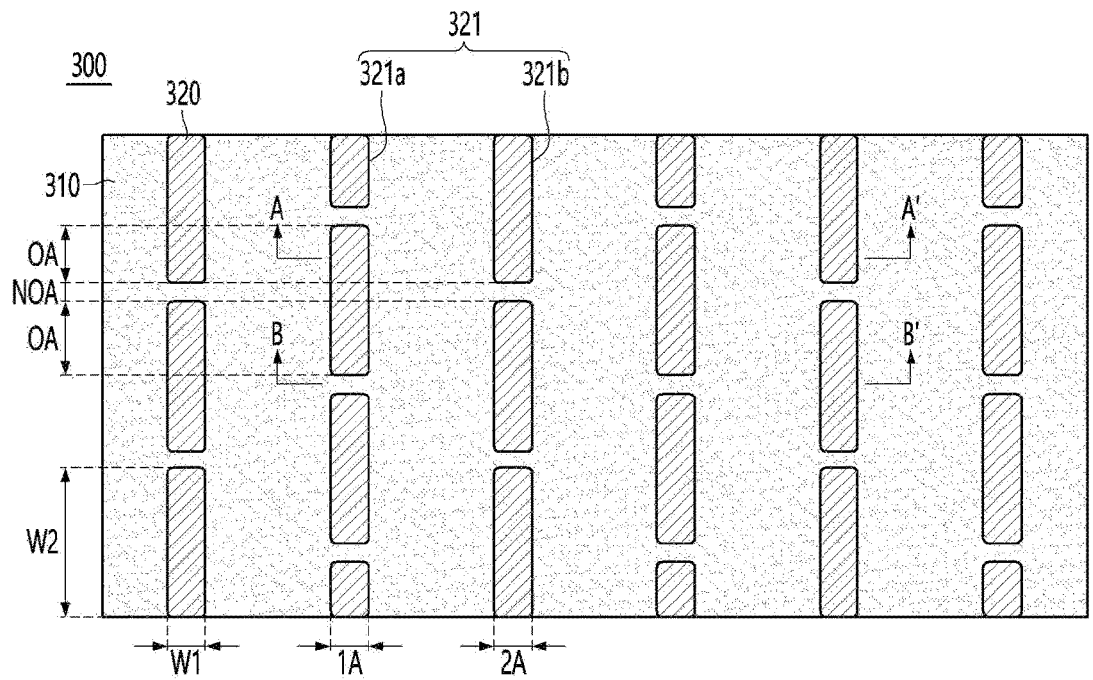
Fig. 16
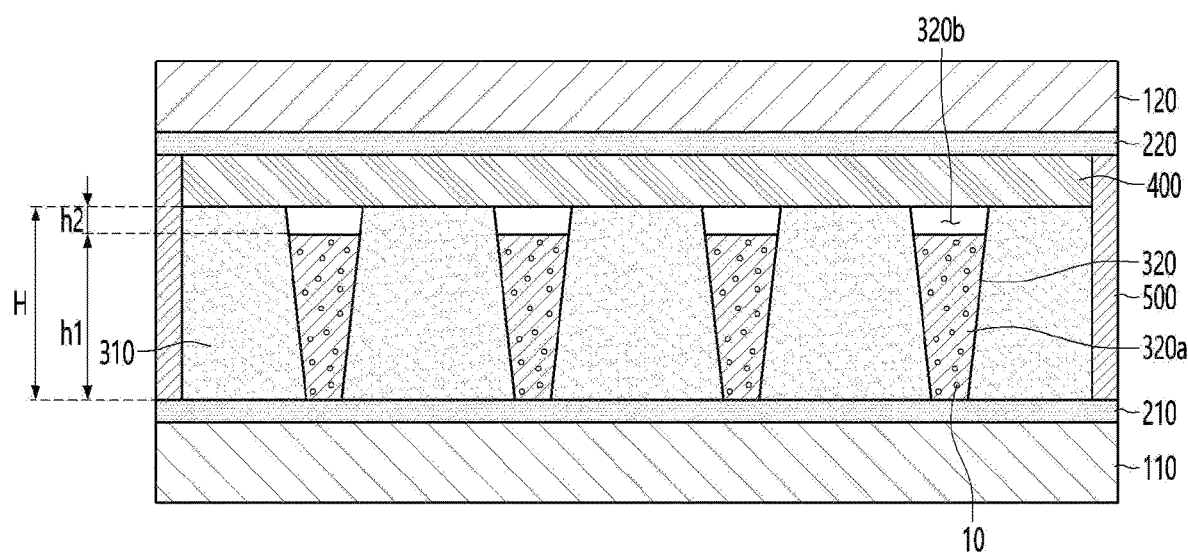

Fig. 23
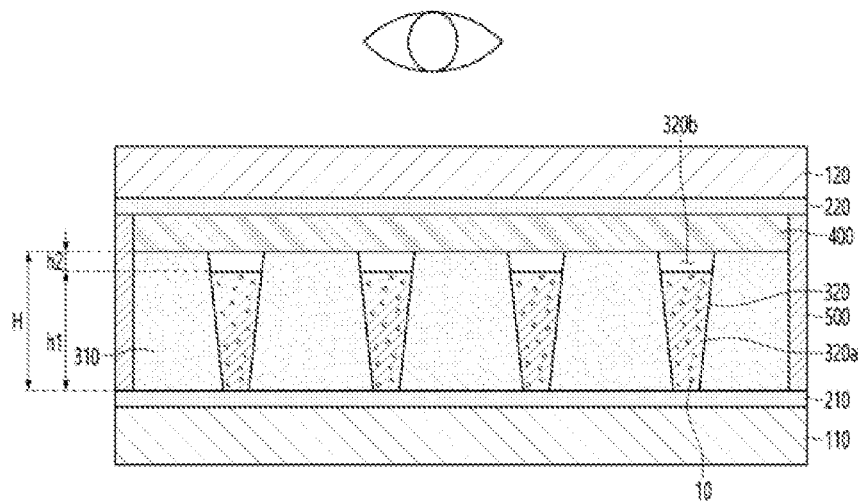
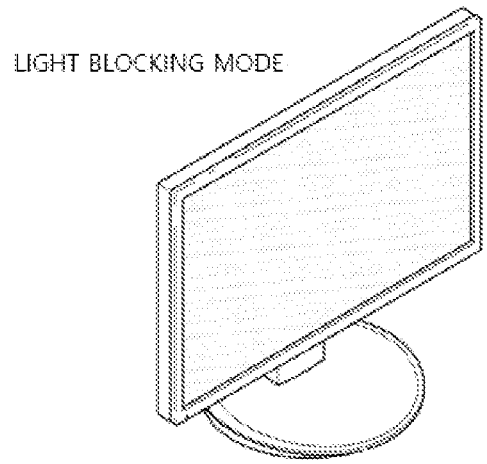
LIGHT BLOCKING MODE

Fig. 24
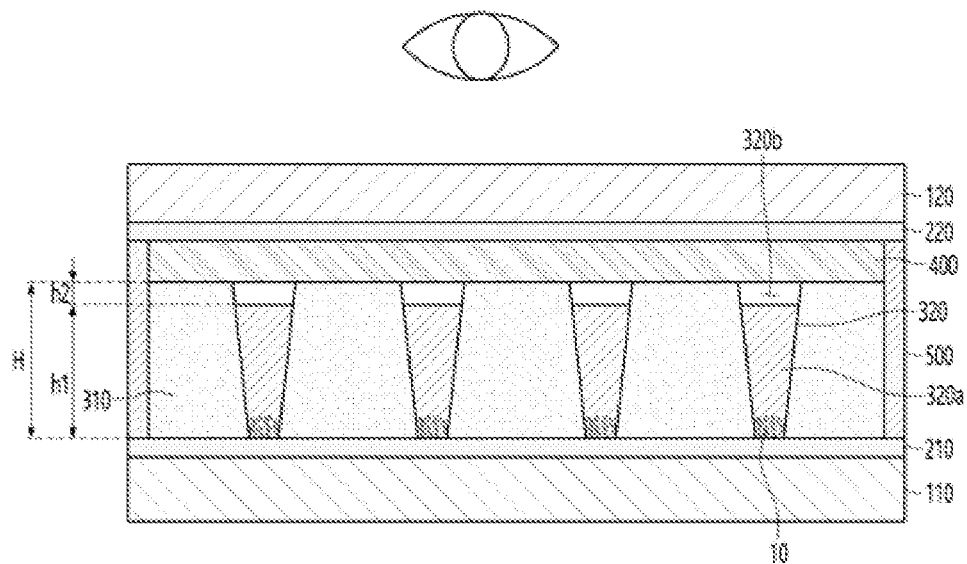
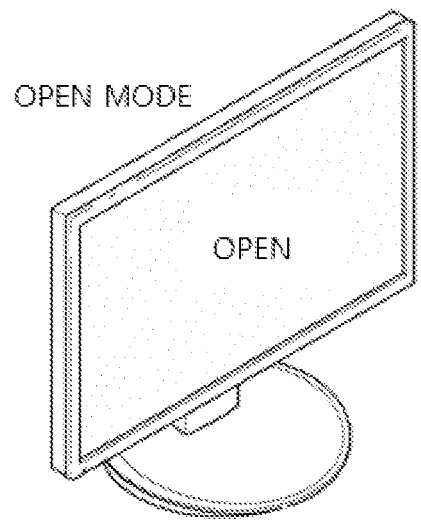

LIGHT ROUTE CONTROL MEMBER AND DISPLAY DEVICE HAVING THE SAME

CROSS-REFERENCE TO RELATED APPLICATIONS

This application is the U.S. national stage application of International Patent Application No. PCT/KR2020/012756, filed Sep. 22, 2020, which claims the benefit under 35 U.S.C. § 119 of Korean Application Nos. 10-2019-0125972, filed Oct. 11, 2019; and 10-2019-0174152, filed Dec. 24, 2019; the disclosures of each of which are incorporated herein by reference in their entirety.

TECHNICAL FIELD

An embodiment relates to a light route control member that can be easily manufactured and has improved front luminance and side shielding effect, and a display device including the same.

BACKGROUND ART

A light-shielding film shields transmitting of light from a light source, and is attached to a front surface of a display panel which is a display device used for a mobile phone, a notebook, a tablet PC, a vehicle navigation device, a vehicle touch, etc., so that the light-shielding film adjusts a viewing angle of light according to an incident angle of light to express a clear image quality at a viewing angle needed by a user when the display transmits a screen.

In addition, the light-shielding film may be used for the window of a vehicle, building or the like to shield outside light partially to inhibit glare, or to inhibit the inside from being visible from the outside.

That is, the light-shielding film may be a light route control member that controls a movement path of light, block light in a specific direction, and transmit light in a specific direction. Accordingly, by controlling the light transmission angle by the light-shielding film, it is possible to control the viewing angle of the user.

Meanwhile, such a light-shielding film may be a light-shielding film that can always control the viewing angle regardless of the surrounding environment or the user's environment, and switchable light-shielding film that allows the user to turn on/off the viewing angle control according to the surrounding environment or the user's environment may be distinguished.

Such a switchable light-shielding film may be implemented by adding electrically moving particles to the pattern part and changing the pattern part into a light transmitting part and a light blocking part by dispersion and aggregation of the particles.

At this time, a dispersion for dispersing a charged particles and the charged particles moving according to the application of voltage may be disposed inside the receiving part.

Such a receiving part may be formed by immersing the base material having the receiving part in a jig containing the dispersion in which the charged particles are dispersed, and injecting the dispersion into the receiving part through a capillary phenomenon.

However, there is a problem in that it is difficult to inject the same amount of the dispersion at the same speed in each of the receiving parts, and the process time increases as the size of the receiving part increases.

Accordingly, there is a need for a light route control member having improved front luminance while solving the above problems.

DISCLOSURE

Technical Problem

An embodiment relates to a light route control member that can be easily manufactured and has improved front luminance and side shielding effect, and a display device including the same.

Technical Solution

A light route control member according to embodiment includes a first substrate, a first electrode disposed on an upper surface of the first substrate, a second substrate disposed on the first substrate, a second electrode disposed on a lower surface of the second substrate, and a light conversion part disposed between the first electrode and the second electrode and defining a first direction and a second direction, and the light conversion part includes a partition wall part and a receiving part that are alternately disposed in the first direction, and the receiving part includes a plurality of cells spaced apart from each other in the second direction, and at least one of the cells includes a first inner surface and a second inner surface connected to each other, and at least one inner surface of the first inner surface and the second inner surface extends in a direction different from the first direction and the second direction.

Advantageous Effects

The light route control member and the method for manufacturing the same according to the embodiment form a receiving part having a predetermined size and having an intaglio shape in a resin layer, the dispersion can be easily filled in the receiving part by a method such as squeezing or screen printing.

That is, by forming a separation part in the receiving part and controlling the size of the receiving part to the size of a certain unit, the filling properties of the dispersion can be satisfied even by squeezing or screen printing.

In addition, by forming a plurality of separation parts in the receiving part, the frontal luminance of the light route control member may be improved by the separation parts.

In addition, by arbitrarily controlling the angles of the inner surfaces connected to each other of the receiving part, the process efficiency can be improved by omitting the process of arbitrarily tilting the filling direction when the dispersion is filled.

In addition, by controlling the arrangement of the separation part of each receiving part or the separation part between the plurality of receiving parts in the receiving part including a plurality of receiving parts, visibility can be improved while easily controlling side shielding and front luminance according to the environment to be used.

In addition, in the light route control member according to the embodiment, the dispersion disposed inside the receiving part may be disposed to be lower than the height of the receiving part. Accordingly, when the light conversion part and the substrate are adhered through the adhesive layer, it is possible to inhibit the adhesive material from coming into contact with the dispersion of the light conversion part. Accordingly, the light route control member according to the embodiment may inhibit the adhesive properties of the adhesive layer from being reduced due to the contact between the adhesive material and the dispersion. Thereby, it is possible to have improved reliability.

In addition, when disposing the adhesive layer, it is possible to inhibit the dispersion from overflowing to the outside, that is, to the partition wall part due to the pressure caused by the bonding process. Accordingly, the light route control member according to the embodiment may inhibit staining due to overflow of the dispersion, and thus may have improved visibility.

In addition, when the light route control member according to the embodiment is used by being attached to the display panel, it is possible to inhibit a moire phenomenon formed by overlapping with a pixel pattern included in the display panel. That is, by randomly forming the size and spacing of the receiving parts of the light route control member, or randomly forming an arrangement, it is possible to minimize a moire phenomenon that may occur when the pattern of the receiving parts and the pixel pattern overlap. Accordingly, the visibility of the light route control member may be improved by minimizing the moire phenomenon.

DESCRIPTION OF DRAWINGS

FIGS. 6 to 9 are views showing top views of a light conversion part of a light route control member according to an embodiment.

FIG. 15 is view showing another cross-sectional view of a light route control member according to another embodiment.

FIGS. 16 and 17 are a cross-sectional view taken along line A-A' of FIG. 15.

FIGS. 23 and 24 are views for describing one embodiment of the display device to which the light route control member according to the embodiment is applied.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a light route control member according to an embodiment will be described with reference to drawings. The light route control member described below relates to a switchable light route control member that drives in various modes according to the movement of electrophoretic particles application of a voltage.

Figure 1:
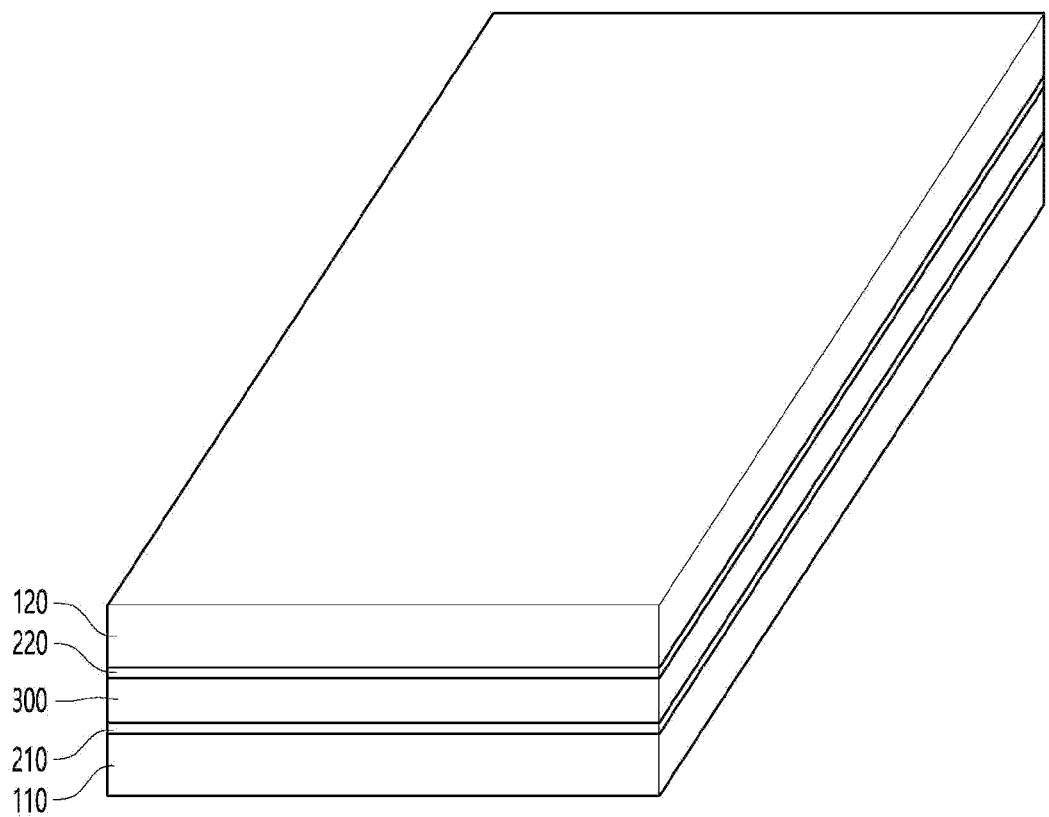
FIG. 1 is a view showing a perspective view of a light route control member to which electrophoretic particles are applied according to an embodiment.
Figure 2:
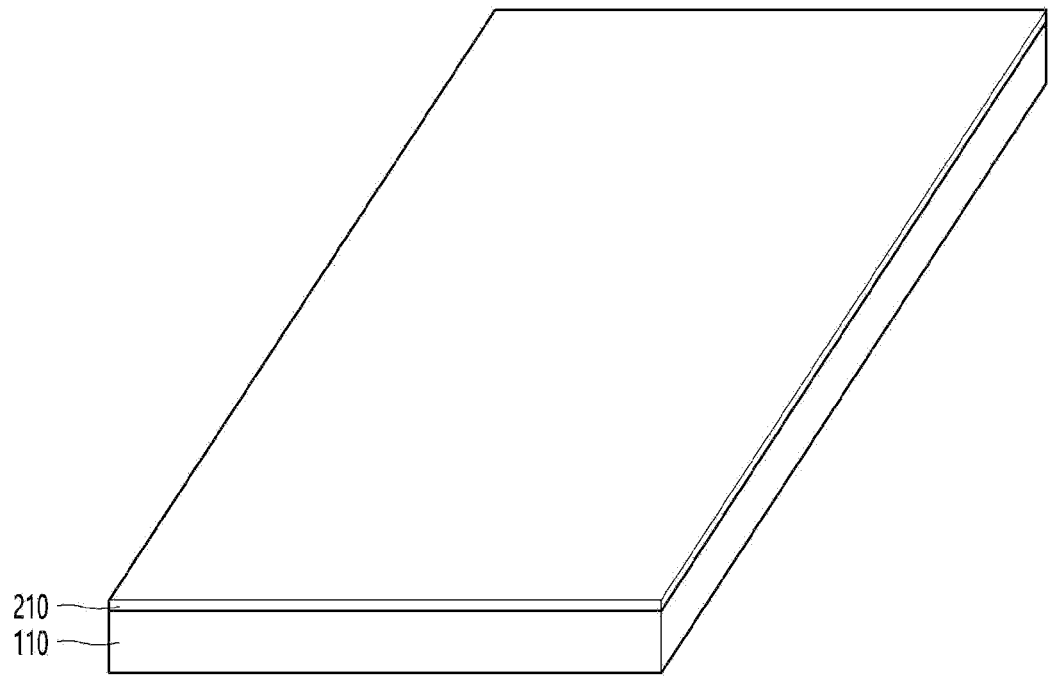
FIGS. 2 and 3 are views showing a perspective view of a first substrate and a first electrode, and a second substrate and a second electrode of the light route control member according to the embodiment, respectively.
Figure 3:
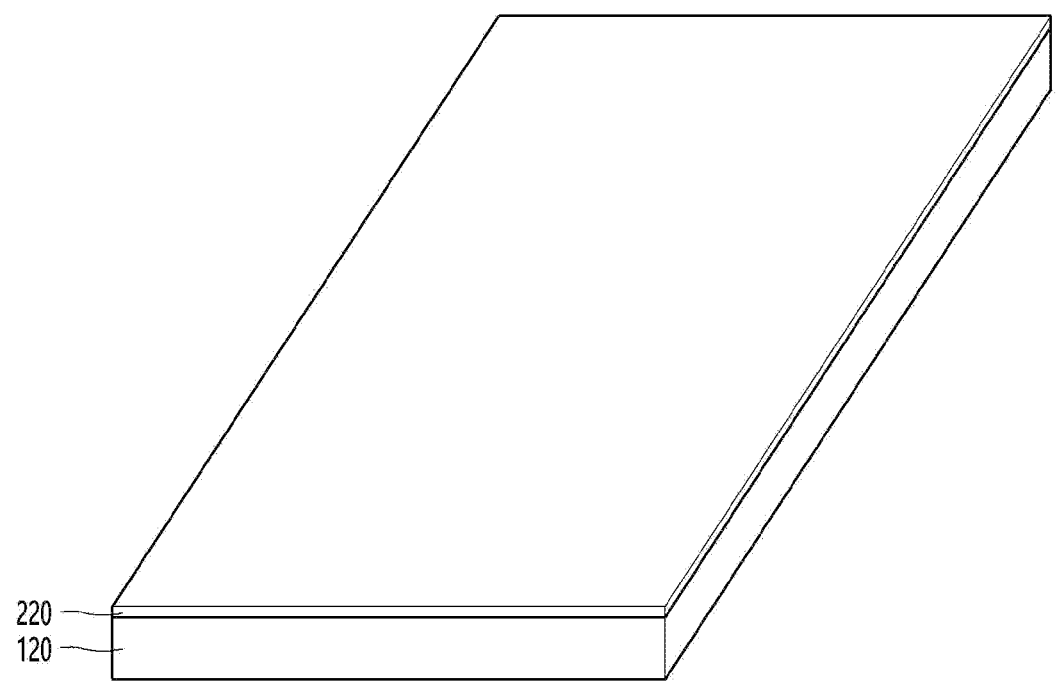

Referring to FIGS. 1 to 3, a light route control member according to an embodiment may include a first substrate 110, a second substrate 120, a first electrode 210, a second electrode 220, and a light conversion part 300.

The first substrate 110 may support the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

Further, the first substrate 110 may be a curved or bended substrate. That is, the light route control member including the first substrate 110 may also be formed to have flexible, curved, or bent characteristics. Accordingly, the light route control member according to the embodiment may be changed to various designs.

The first substrate 110 may have a thickness of 30 um to 100 um.

The first electrode 210 may be disposed on one surface of the first substrate 110. In detail, the first electrode 210 may be disposed on an upper surface of the first substrate 110. That is, the first electrode 210 may be disposed between the first substrate 110 and the second substrate 120.

The first electrode 210 may contain a transparent conductive material. For example, the first electrode 210 may contain a metal oxide such as indium tin oxide, indium zinc oxide, copper oxide, tin oxide, zinc oxide, titanium oxide, etc.

The first electrode 210 may be disposed on the first substrate 110 in a film shape. In detail, light transmittance of the first electrode 210 may be about 80% or more.

The first electrode 210 may have a thickness of about 0.1 um to about 0.5 um.

Alternatively, the first electrode 210 may contain various metals to realize low resistance. For example, the first electrode 210 may contain at least one metal of chromium (Cr), nickel (Ni), copper (Cu), aluminum (Al), silver (Ag), molybdenum (Mo). gold (Au), titanium (Ti), and alloys thereof.

The first electrode 210 may be disposed on the entire surface of one surface of the first substrate 110. In detail, the first electrode 210 may be disposed as a surface electrode on one surface of the first substrate 110. However, the embodiment is not limited thereto, and the first electrode 210 may be formed of a plurality of pattern electrodes having a predetermined pattern.

For example, the first electrode 210 may include a plurality of conductive patterns. In detail, the first electrode 210 may include a plurality of mesh lines intersecting each other and a plurality of mesh openings formed by the mesh lines.

Accordingly, even though the first electrode 210 contains a metal, visibility may be improved because the first electrode is not visible from the outside. In addition, the light transmittance is increased by the openings, so that the brightness of the light route control member according to the embodiment may be improved.

The second substrate 120 may be disposed on the first substrate 110. In detail, the second substrate 120 may be disposed on the first electrode 210 on the first substrate 110.

The second substrate 120 may contain a material capable of transmitting light. The second substrate 120 may contain a transparent material. The second substrate 120 may contain a material the same as or similar to that of the first substrate 110 described above.

For example, the second substrate 120 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the second substrate 120 may be a flexible substrate having flexible characteristics.

Further, the second substrate 120 may be a curved or bended substrate. That is, the light route control member including the second substrate 120 may also be formed to have flexible, curved, or bent characteristics. Accordingly, the light route control member according to the embodiment may be changed to various designs.

The second substrate 120 may have a thickness of 30 um to 100 um.

The second electrode 220 may be disposed on one surface of the second substrate 120. In detail, the second electrode 220 may be disposed on a lower surface of the second substrate 120. That is, the second electrode 220 may be disposed on a surface on which the second substrate 120 faces the first substrate 110. That is, the second electrode 220 may be disposed facing the first electrode 210 on the first substrate 110. That is, the second electrode 220 may be disposed between the first electrode 210 and the second substrate 120.

The second electrode 220 may contain a transparent conductive material. For example, the second electrode 220 may contain a metal oxide such as indium tin oxide, indium zinc oxide, copper oxide, tin oxide, zinc oxide, titanium oxide, etc.

The second electrode 220 may be disposed on the first substrate 110 in a film shape. In addition, the light transmittance of the second electrode 220 may be about 80% or more.

The second electrode 220 may have a thickness of about 0.1 um to about 0.5 um.

Alternatively, the second electrode 220 may contain various metals to realize low resistance. For example, the second electrode 220 may contain at least one metal of chromium (Cr), nickel (Ni), copper (Cu), aluminum (Al), silver (Ag), molybdenum (Mo). gold (Au), titanium (Ti), and alloys thereof.

The second electrode 220 may be disposed on the entire surface of one surface of the second substrate 120. In detail, the second electrode 220 may be disposed as a surface electrode on one surface of the second substrate 120. However, the embodiment is not limited thereto, and the second electrode 220 may be formed of a plurality of pattern electrodes having a predetermined pattern.

For example, the second electrode 220 may include a plurality of conductive patterns. In detail, the second electrode 220 may include a plurality of mesh lines intersecting each other and a plurality of mesh openings formed by the mesh lines.

Accordingly, even though the second electrode 220 contains a metal, visibility may be improved because the second electrode 220 is not visible from the outside. In addition, the light transmittance is increased by the openings, so that the brightness of the light route control member according to the embodiment may be improved.

The light conversion part 300 may be disposed between the first substrate 110 and the second substrate 120. In detail, the light conversion part 300 may be disposed between the first electrode 210 and the second electrode 220.

The light conversion part 300 may be bonded to the first electrode 210 and the second electrode 220. For example, a buffer layer for improving adhesion with the light conversion part 300 is disposed on the first electrode 210, and the first electrode 210 and the light conversion part 300 may be formed through the buffer layer. In addition, an adhesive layer 400 for adhesion to the light conversion part 300 is disposed under the second electrode 220, and the second electrode 220 and the light conversion part 300 may be adhered to each other through the adhesive layer 400.

Figure 4:
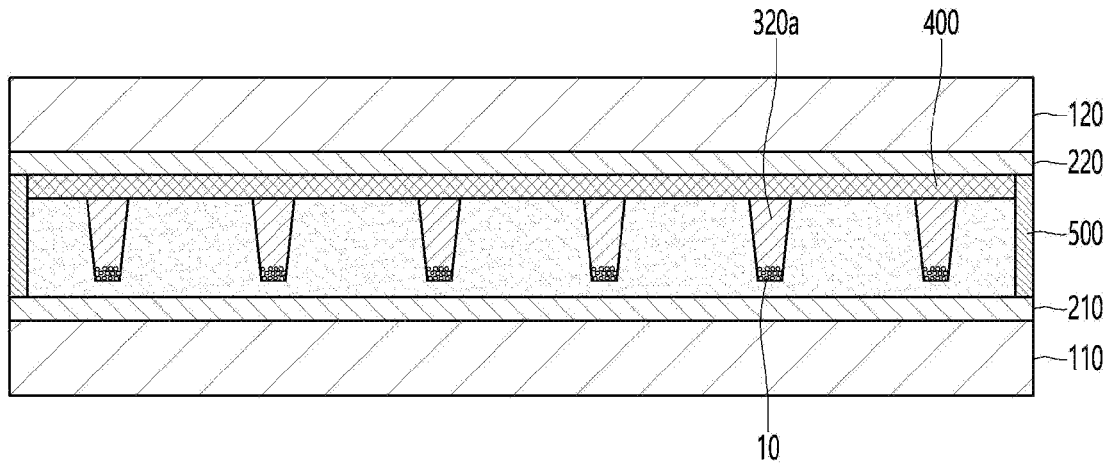
FIGS. 4 and 5 are views showing a cross-sectional view of a light route control member according to embodiment.
Figure 5:
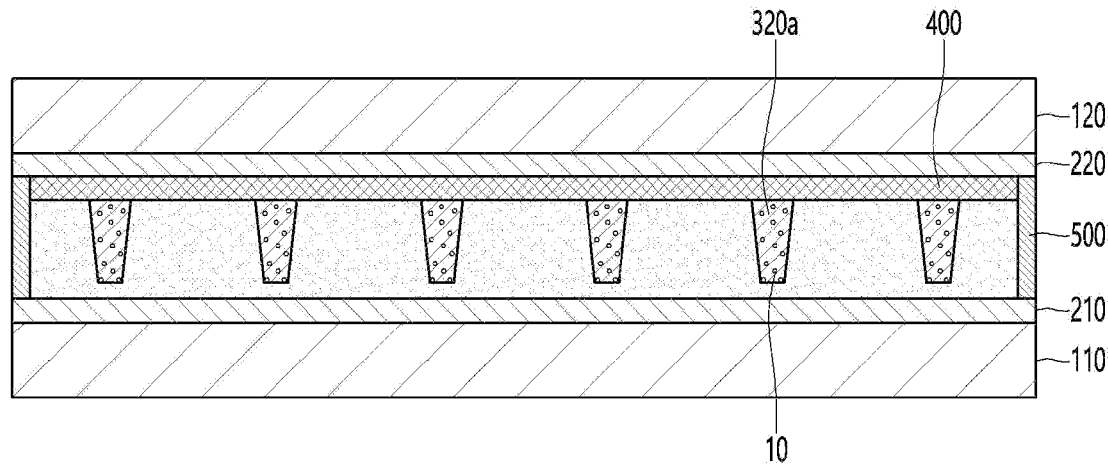

Referring to FIGS. 4 and 5, the light conversion part 300 may include a partition wall part 310 and a receiving part 320.

The partition wall part 310 may be defined as a partition wall part region that partitions the receiving part. That is, the partition wall part 310 is a partition wall part region that partitions a plurality of receiving part. In addition, the receiving part 320 may be defined as a region that changes into a light blocking part and a light transmitting part according to the application of a voltage.

The partition wall part 310 and the receiving part 320 may be alternately disposed with each other. The partition wall part 310 and the receiving part 320 may be disposed to have different widths. For example, the width of the partition wall part 310 may be greater than the width of the receiving part 320.

The partition wall part 310 and the receiving part 320 may be alternately disposed. In detail, the partition wall part 310 and the receiving part 320 may be alternately disposed. That is, each of the partition wall parts 310 may be disposed between the receiving parts 320 adjacent to each other, and each of the receiving parts 320 may be disposed between the partition wall parts 310 adjacent to each other.

The partition wall part 310 may contain a transparent material. The partition wall part 310 may contain a material that may transmit light.

The partition wall part 310 may contain a resin material. For example, the partition wall part 310 may contain a photo-curable resin material. As an example, the partition wall part 310 may contain a UV resin or a transparent photoresist resin. Alternatively, the partition wall part 310 may contain urethane resin or acrylic resin.

The partition wall part 310 may transmit light incident on any one of the first substrate 110 and the second substrate 120 toward another substrate.

For example, in FIGS. 4 and 5, light may be emitted from a lower portion of the first substrate 110 and may be incident in a direction toward the second substrate 120. The partition wall part 310 transmits the light, and the transmitted light may move to an upper portion of the second substrate 120.

A sealing part 500 sealing the light route control member may be disposed on a side surface of the partition wall part. And a side surface of the light conversion part 300 may be sealed by the sealing part.

The receiving part 320 may include the dispersion 320a and the light conversion particles 10. In detail, the receiving part 320 is filled with the dispersion 320a, and a plurality of the light conversion particles 10 may be dispersed in the dispersion 320a.

The dispersion 320a may be a material for dispersing the light conversion particles 10. The dispersion 320a may contain a transparent material. The dispersion 320a may contain a non-polar solvent. In addition, the dispersion 320a may contain a material capable of transmitting light. For example, the dispersion 320a may include at least one of a halocarbon-based oil, a paraffin-based oil, and isopropyl alcohol.

The light conversion particles 10 may be disposed to be dispersed in the dispersion 320a. In detail, the plurality of light conversion particles 10 may be disposed to be spaced apart from each other in the dispersion 320a.

The light conversion particles 10 may be a charged particle. The light conversion particles may have a color. For example, the light conversion particles 10 may include black charged carbon black particles.

The light transmittance of the receiving part 320 may be changed by the light conversion particles 10. In detail, the receiving part 320 may be changed into the light blocking part and the light transmitting part by changing the light transmittance due to the light conversion particles 10. That is, the receiving part 320 may change the transmittance of the light passing through the receiving part 320 by dispersion and aggregation of the light conversion particles 10 disposed therein in the dispersion 320a.

For example, the light route control member according to the embodiment may be changed from a first mode to a second mode or from the second mode to the first mode by a voltage applied to the first electrode 210 and the second electrode 220.

In detail, in the light route control member according to the embodiment, the receiving part 320 becomes the light blocking part in the first mode, and light of a specific angle may be blocked by the receiving part 320. That is, a viewing angle of the user viewing from the outside may be narrowed.

In addition, in the light route control member according to the embodiment, the receiving part 320 becomes the light transmitting part in the second mode, and in the light route control member according to the embodiment, light may be transmitted through both the partition wall part 310 and the receiving part 320. That is, the viewing angle of the user viewing from the outside may be widened.

Switching from the first mode to the second mode, that is, the conversion of the receiving part 320 from the light blocking part to the light transmitting part may be realized by movement of the light conversion particles 10 of the receiving part 320. Thai is, the light absorbing particle 10 has a charge on the surface, and may be moved in the direction of the first electrode or the second electrode by the application of a voltage according to the characteristics of the charge. That is, the light absorbing particle 10 may be an electrophoretic particle.

In detail, the receiving part 320 may be electrically connected to the first electrode 210 and the second electrode 220.

In this case, when a voltage is not applied to the light route control member from the outside, the light conversion particles 10 of the receiving part 320 are uniformly dispersed in the dispersion 320a, and light may be blocked by the light conversion particles in the receiving part 320. Accordingly, in the first mode, the receiving part 320 may be driven as the light blocking part.

Alternatively, when a voltage is applied to the light route control member from the outside, the light conversion particles 10 may move. For example, the light conversion particles 10 may move toward one end or the other end of the receiving part 320 by a voltage transmitted through the first electrode 210 and the second electrode 220. That is, the light conversion particles 10 may move from the receiving part 320 toward the first electrode or the second electrode.

In detail, when a voltage is applied to the first electrode 210 and/or the second electrode 220, an electric field is formed between the first electrode 210 and the second electrode 220, and the charged light conversion particles may be moved toward a positive electrode of the first electrode 210 and the second electrode 220 using the dispersion 320a as a medium.

That is, when the voltage is applied to the first electrode 210 and/or the second electrode 220, as shown in FIG. 4, the light conversion particles 10 may be moved toward the first electrode 210 in the dispersion 320a. That is, the light conversion particles 10 are moved in one direction, and the receiving part 320 may be driven as the light transmitting part.

In addition, when the voltage is not applied to the first electrode 210 and/or the second electrode 220, as shown in FIG. 5, the light conversion particles 10 may be uniformly dispersed in the dispersion 320a to drive the receiving part 320 as the light blocking part.

Accordingly, the light route control member according to the embodiment may be driven in two modes according to a user's surrounding environment. That is, when the user requires light transmission only at a specific viewing angle, the receiving part is driven as the light blocking part, or in an environment in which the user requires high brightness, a voltage may be applied to drive the receiving part as the light transmitting part.

Therefore, since the light route control member according to the embodiment may be implemented in two modes according to the user's requirement, the light route control member may be applied regardless of the user's environment.

FIGS. 6 to 9 are views showing another cross-sectional view of a light route control member according to embodiment.

Figure 6:
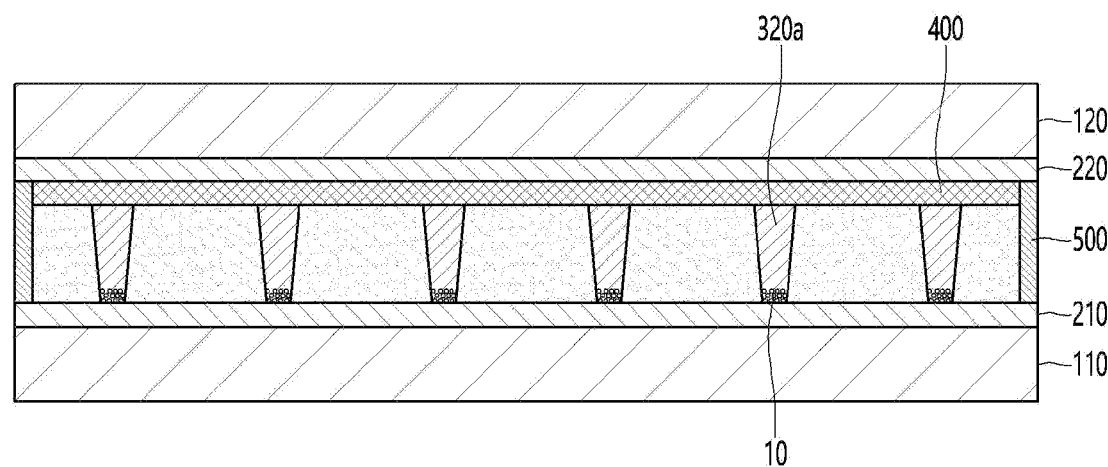
FIGS. 6 to 9 are views showing another cross-sectional view of a light route control member according to embodiment.
Figure 7:
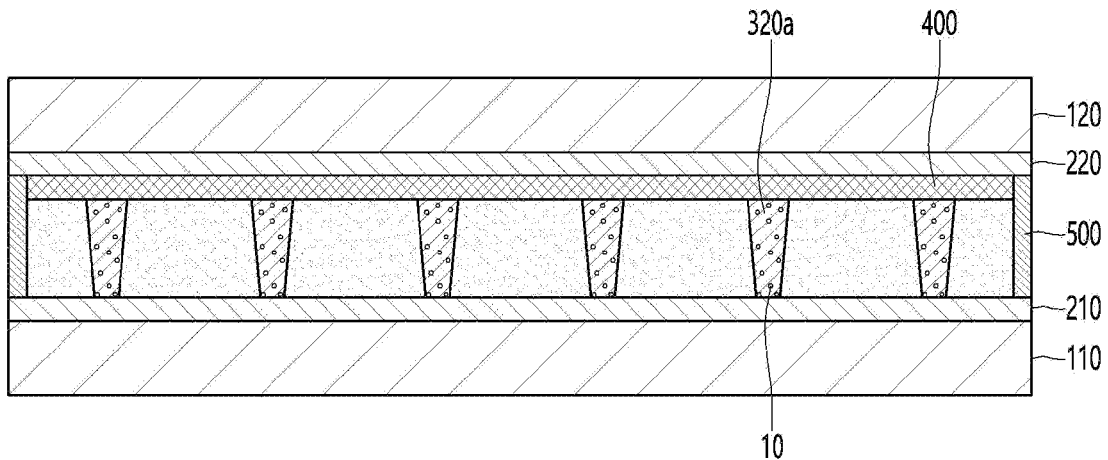

Referring to FIGS. 6 and 7, in the light ROUTE control member according to the embodiment, the receiving part 320 may be disposed in contact with the electrode differently from FIGS. 4 and 5.

For example, the receiving part 320 may be disposed in direct or indirect contact with the first electrode 210.

Accordingly, since the first electrode 210 and the receiving part 320 are disposed in direct contact with each other without being spaced apart, the voltage applied from the first electrode 210 may be easily transferred to the receiving part 320.

Accordingly, since the moving speed of the light conversion particle 10 inside the receiving part 320 can be improved, the driving characteristics of the light route control member can be improved. r.

Figure 8:
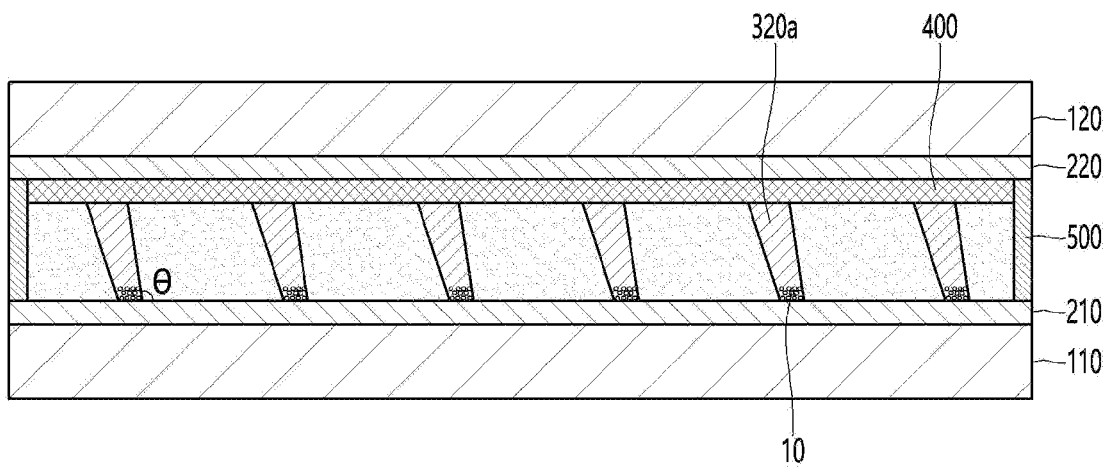
Figure 9:
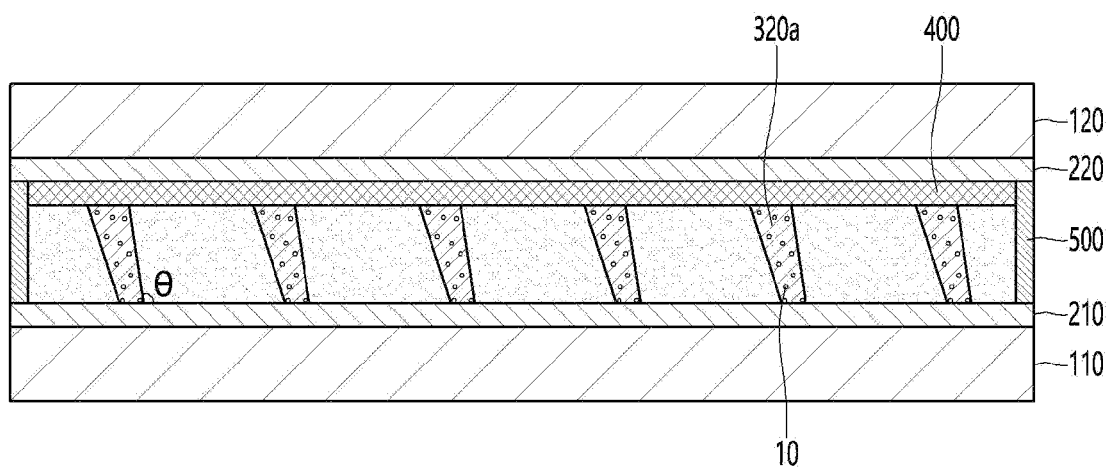

In addition, referring to FIGS. 8 and 9, in the light route control member according to the embodiment, unlike FIGS. 4 and 5, the receiving part 320 may be disposed while having a constant inclination angle θ.

In detail, referring to FIGS. 8 and 9, the receiving part 320 may be disposed while having an inclination angle θ of greater than 0° to less than 90° with respect to the first electrode 210. In detail, the receiving part 320 may extend upwardly while having an inclination angle θ of greater than 0° to less than 90° with respect to one surface of the first electrode 210.

Accordingly, when the light route member is used together with the display panel, by inhibiting moire caused by overlapping of the pattern of the display panel and the receiving part 320 of the light route control member, the user's visibility may be improved.

As described above, the light conversion part 300 may include a receiving part formed in a plurality of pattern shapes to control the viewing angle of light.

Accordingly, visibility of a user viewing a display or the like through the light route control member by the receiving part may be reduced. That is, the frontal luminance is reduced due to a decrease in the amount of light transmitted in the direction of the user by the receiving part, and thus the visibility of the user may be reduced.

In addition, as the width of the pattern shape of the receiving part extending in one direction increases, there is a problem in that the process efficiency is reduced when the dispersion containing the electrophoretic particles is filled in the receiving part.

Accordingly, the light route control member according to the embodiment forms a plurality of separation part in the receiving part, the front luminance of the light route control member may be improved, and process efficiency may be improved.

Hereinafter, the light conversion part of the light route control member according to the embodiment will be described in detail with reference to FIGS. 10 to 14.

Figure 10:
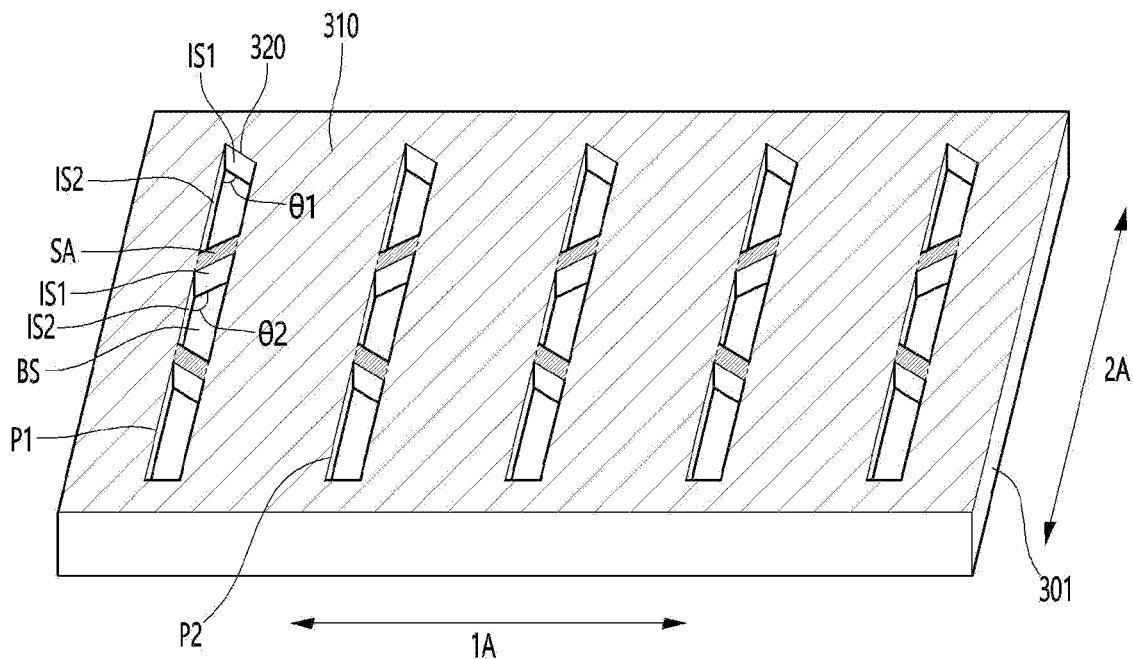
FIGS. 10 to 14 are views showing another cross-sectional view of a light route control member according to embodiment.
Figure 11:
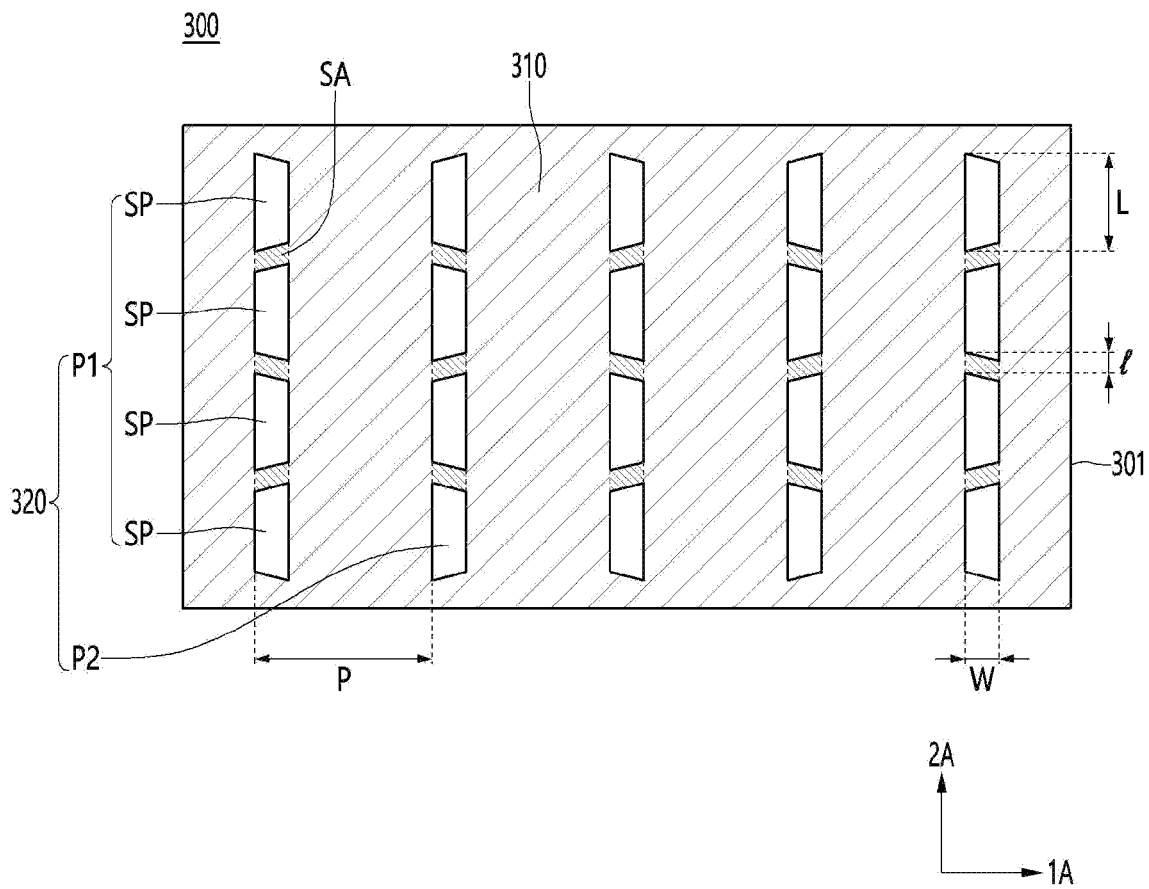

FIG. 10 is a perspective view of the light conversion part, and FIG. 11 is a top view of the light conversion part Referring to FIGS. 10 and 11, the light conversion part 300 includes a resin layer 301 constituting the light conversion part 300, and the partition wall part 310 and the receiving part 320 may be formed in the resin layer 301.

The light conversion part 300 may be defined in a first direction 1A and a second direction 2A. For example, the first direction 1A may be defined as a long side direction of the light conversion part, and the second direction 2A may be defined as a short side direction of the light conversion part.

In addition, the first direction 1A and the second direction 2A may correspond to the filling direction of the dispersion filled in the receiving part 320 and including the light conversion particles. That is, the dispersion may be filled in any one of the first direction 1A and the second direction 2A through a squeezing or screen-printing process.

The receiving part 320 may be formed in the resin layer 301. In detail, the receiving part 320 is formed in the shape of an intaglio formed in the resin layer 301, the intaglio portion may be formed to extend in the second direction.

That is, the receiving part 320 may be disposed to extend in the second direction. In addition, the receiving part 320 may include a plurality of receiving parts spaced apart from each other in the first direction, and partition wall parts 310 may be disposed between the plurality of receiving parts.

For example, the receiving part 320 may include a first receiving part P1 and a second receiving part P2 spaced apart from each other.

At least one of the first receiving part P1 and the second receiving part P2 may include a plurality of separation parts SA. That is, at least one receiving part of the first receiving part P1 and the second receiving part P2 may include a plurality of separation parts dividing the receiving part into a plurality of cells SP.

Accordingly, at least one of the first receiving part P1 and the second receiving part P2 extending in the second direction may include a plurality of cells defined by the separation part SA.

As the cell SP is formed in an intaglio shape on the resin layer 301, the cell SP may include a bottom surface BS and inner surfaces. In addition, the inner surfaces may include a first inner surface IS1 and a second inner surface IS2 connected to each other.

In this case, at least one of the first inner surface IS1 and the second inner surface IS2 may extend in a direction different from the first direction and the second direction.

For example, referring to FIGS. 10 and 11, the first inner surface IS1 may extend in a direction different from the first direction, and the second inner surface IS2 may extend in a direction corresponding to the second direction.

Accordingly, the first inner surface IS1 and the second inner surface IS2 may be connected at an angle of an acute angle θ1 or an obtuse angle θ2. In detail, the first inner surface IS1 and the second inner surface IS2 may be connected at an acute angle of 35° to 55° or at an obtuse angle of 125° to 145°.

That is, the lower and upper surfaces of the cell may be formed in a trapezoidal shape as a whole as shown in FIGS. 10 and 11.

Accordingly, the dispersion can be easily filled in a plurality of cells. In detail, the dispersion may be filled in each of the plurality of cells in any one of the first direction 1A and the second direction 2A through a squeezing or screen-printing process.

At this time, since at least one of the first inner surface IS1 and the second inner surface IS2 extends in a direction different from the first and second directions, the dispersion may be filled in the cell in any one of the first direction 1A and the second direction 2A.

That is, conventionally, the first inner surface IS1 and the second inner surface IS2 extend in directions corresponding to the first and second directions, respectively. Accordingly, when filling the dispersion, there is a problem in that process efficiency is reduced as the filling direction is intentionally tilted to fill.

On the other hand, in the light route control member according to the embodiment, as at least one inner surface of the inner surfaces of the cell filled with the filling liquid is inclined in a direction different from the first and second directions, when filling the dispersion, since it can be filled in the same direction as the first and second directions, process efficiency can be improved.

Meanwhile, referring to FIG. 11, each cell SP may be formed to have a constant length. Here, the length of the cell SP may be defined as the maximum length of the cell SP.

In detail, the cell SP may have a length L of about 50 μm to 150 μm.

The lengths of the plurality of cells SP may be the same or different from each other. That is, the plurality of cells SP may have the same length or may have different lengths within the above range.

The length of the cell SP may be related to the filling characteristics of the dispersion filled into the cell SP. In detail, when the length L of the cell SP is formed to be less than 50 μm, an area of the separation part SA formed in each receiving part is increased, so that the side shielding effect may be reduced.

In addition, when the length (L) of the cell (SP) is formed to exceed 150 μm, as the length of the cell SP increases, the filling characteristics of the dispersion filled into the cell SP may be reduced, and a filling uniformity of the dispersion to be filled into each cell may be reduced.

Referring to FIGS. 10 and 11, each of the receiving parts may include a plurality of separation parts SA.

The plurality of cells included in each receiving part may be partitioned from each other by the separation parts SA.

The separation part SA may be an area integrally formed with the partition wall part 310. That is, the separation part SA may be a region through which light is transmitted regardless of the application of voltage to the receiving parts.

A length 1 of the separation part SA may be smaller than a width w of the cell SP. Here, the length 1 of the separation part SA may be defined as the maximum length 1 of the separation part SA.

In addition, the length 1 of the separation SA may be smaller than the length of the cell SP. Also, a length 1 of the separation part SA may be smaller than a pitch p of the receiving parts. In detail, the length 1 of the separation part SA may be smaller than the pitch p of the first receiving part P1 and the second receiving part P2.

For example, the length 1 of the separation part SA may be equal to or less than 0.5 times the width w of the cell SP.

When the length 1 of the separation part SA exceeds 0.5 times the width w of the cell SP, since the area of the separation part SA is increased, the side shielding effect of the light route control member may be reduced.

Hereinafter, various embodiments of the light route control member according to the embodiment will be described with reference to FIGS. 12 to 14.

Figure 12:
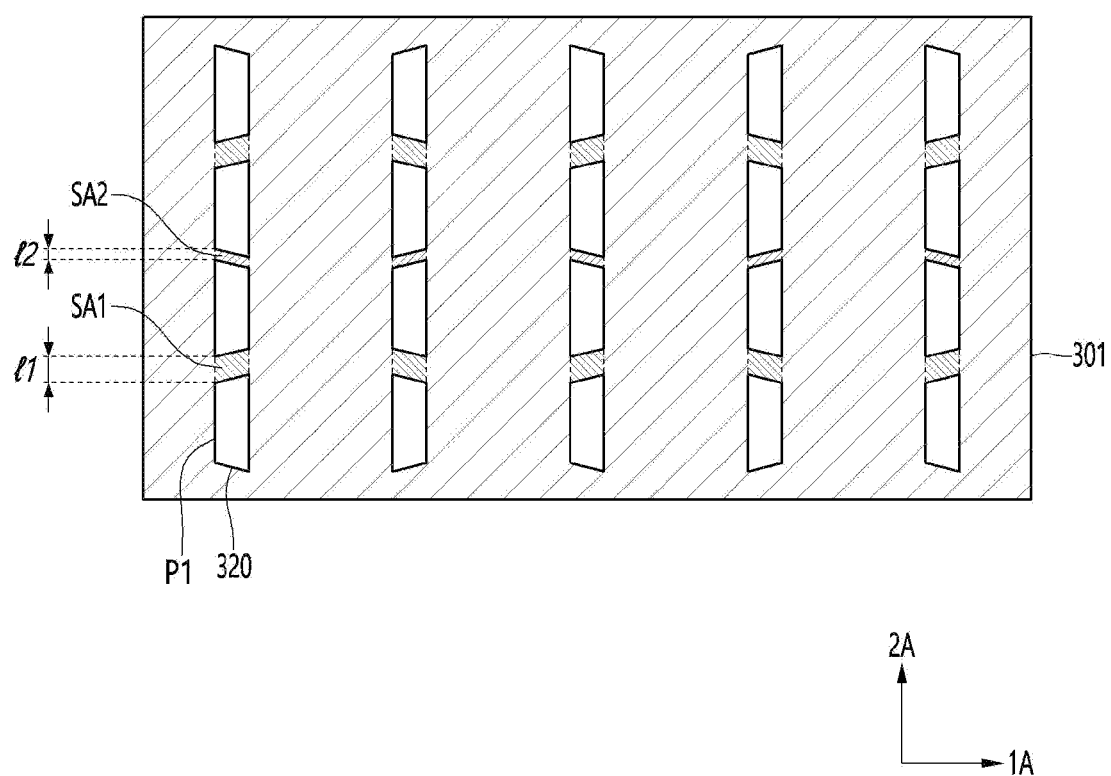

Referring to FIG. 12, the separation parts formed in the receiving parts 320 of the light conversion part 300 may be formed in different sizes in each receiving part.

In detail, the receiving part 320 includes a first receiving part (P1) and a plurality of receiving parts spaced apart from the first receiving part (P1), each of the receiving part may include a first separation part SA1 and a second separation part SA2.

In this case, the first separation SA1 and the second separation SA2 may be formed to have different sizes. That is, the first separation SA1 and the second separation SA2 may be formed to have different lengths.

In detail, the length 11 of the first separation SA1 and the length 12 of the second separation SA2 may be formed to have different sizes. For example, the length 11 of the first separation part SA1 may be greater than the length 12 of the second separation part SA2.

Accordingly, by differently controlling the length of the separation in each receiving part, depending on the environment to be used, it is possible to easily control the front luminance and the side shielding effect.

Figure 13:
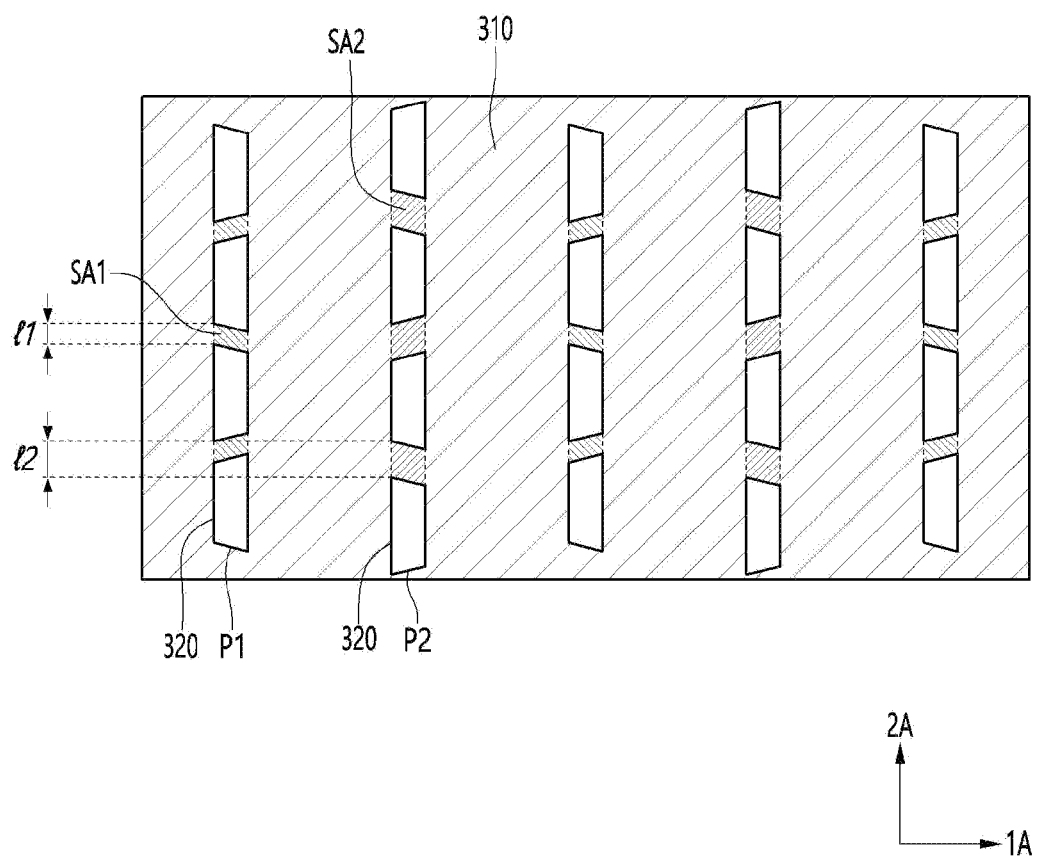

Referring to FIG. 13, the separation parts formed in each of the receiving parts 320 of the light converting part 300 may be formed in different sizes.

In detail, the receiving part 320 includes a first receiving part P1 and a second receiving part P2 spaced apart from the first receiving part P1 through the partition wall part 310, and the first receiving part P1 may include a first separation part SA1, and the second receiving part P2 may include a second separation part SA2.

In this case, the first separation part SA1 and the second separation part SA2 may be formed to have different sizes. That is, the first separation part SA1 and the second separation part SA2 may be formed to have different lengths.

In detail, the length 11 of the first separation part SA1 and the length 12 of the second separation part SA2 may be formed to have different sizes. For example, the length 11 of the first separation part SA1 may be smaller than the length 12 of the second separation part SA2.

Accordingly, by differently controlling the length of the separation in each receiving part, depending on the environment to be used, it is possible to easily control the front luminance and the side shielding effect.

Figure 14:
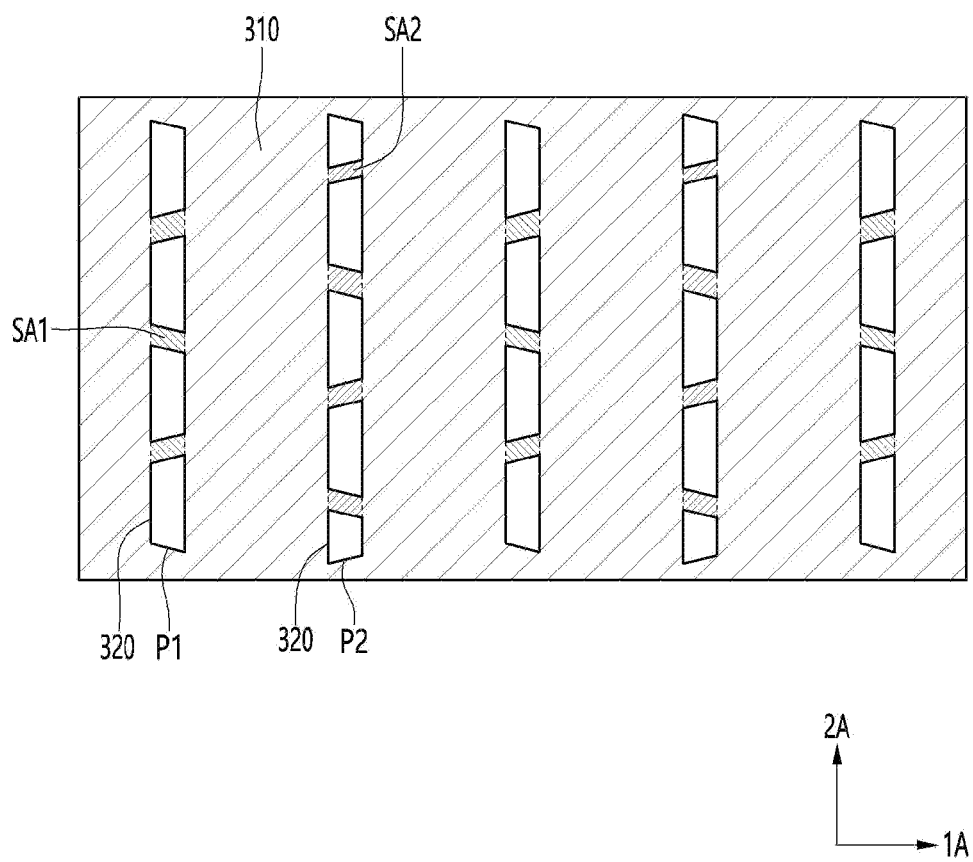

Referring to FIG. 14, the separation parts formed in the receiving part 320 of the light conversion part 300 may be formed so that adjacent receiving parts do not overlap each other.

In detail, the receiving part 320 includes a first receiving part P1 and a second receiving part P2 spaced apart from the first receiving part P1 through the partition wall part 310, and the first receiving part P1 includes a first separation part SA1, and the second receiving part P2 may include a second separation part SA2.

In this case, the first separation SA1 and the second separation part SA2 may be disposed so as not to overlap each other.

In detail, the first separation part SA1 and the second separation part SA2 may be respectively disposed at positions that do not overlap each other in the first direction 1A.

Accordingly, it is inhibited that the separation part is concentrated in one region of the light route control member. Thereby, it is possible to inhibit the separation part from being recognized, and it is possible to inhibit the side shielding effect from being reduced in one area.

In the method for manufacturing the light route control member according to the embodiment, since the receiving part having a predetermined size and an intaglio shape is formed in the resin layer, the dispersion can be easily filled in the receiving part by a method such as squeezing or screen-printing.

That is, since a separation part is formed in the receiving part and the size of the receiving part is controlled to a certain unit size, it can be filled while satisfying the filling properties of the dispersion even by squeezing or screen-printing.

In addition, since a plurality of separation parts are formed in the receiving part, the front luminance of the light route control member can be improved by the separation part.

In addition, since the angle of the inner surfaces connected to each other of the receiving part is arbitrarily controlled, process efficiency can be improved by omitting the process of arbitrarily tilting the filling direction when the dispersion is filled.

In addition, in the receiving part including a plurality of receiving parts, since the arrangement of the separation part of each receiving part or the separation part between the plurality of receiving parts is controlled, visibility can be improved while easily controlling side shielding and front luminance according to the environment to be used.

Hereinafter, a light route control member according to another embodiment will be described with reference to FIGS. 15 to 21. In the description of the light route control member according to another embodiment, descriptions that are the same as and similar to those of the light route control member according to the above-described embodiment will be omitted, and the same reference numerals will be given to the same components.

FIG. 15 is a view illustrating a top view of the light conversion part 300 of the light route control member according to another embodiment. Referring to FIG. 15, the light conversion part 300 may include a plurality of receiving parts 320 and a partition wall part 310 between the receiving units 320.

The receiving part 320 may include a plurality of receiving parts spaced apart from each other. The plurality of receiving parts may be formed to extend in one direction. The partition wall part 310 may be disposed in the spaced region of the receiving parts.

That is, the receiving part 320 includes a plurality of receiving parts. In detail, the receiving part 320 includes a plurality of unit receiving cells. In more detail, the receiving part 320 includes a plurality of unit receiving cells spaced apart from each other.

The receiving part disposed in each column may be disposed to be shifted from each other. That is, each receiving part disposed in each column may include an overlapping area OA and a non-overlapping area NOA.

Figure 17:
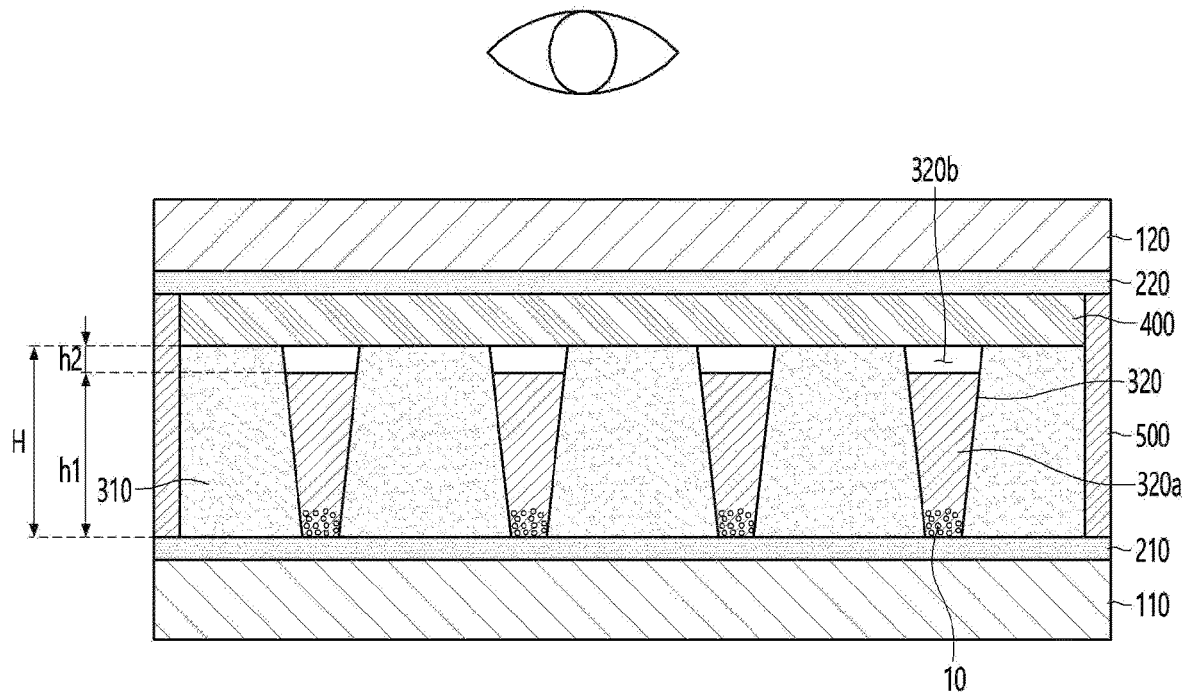
Figure 18:
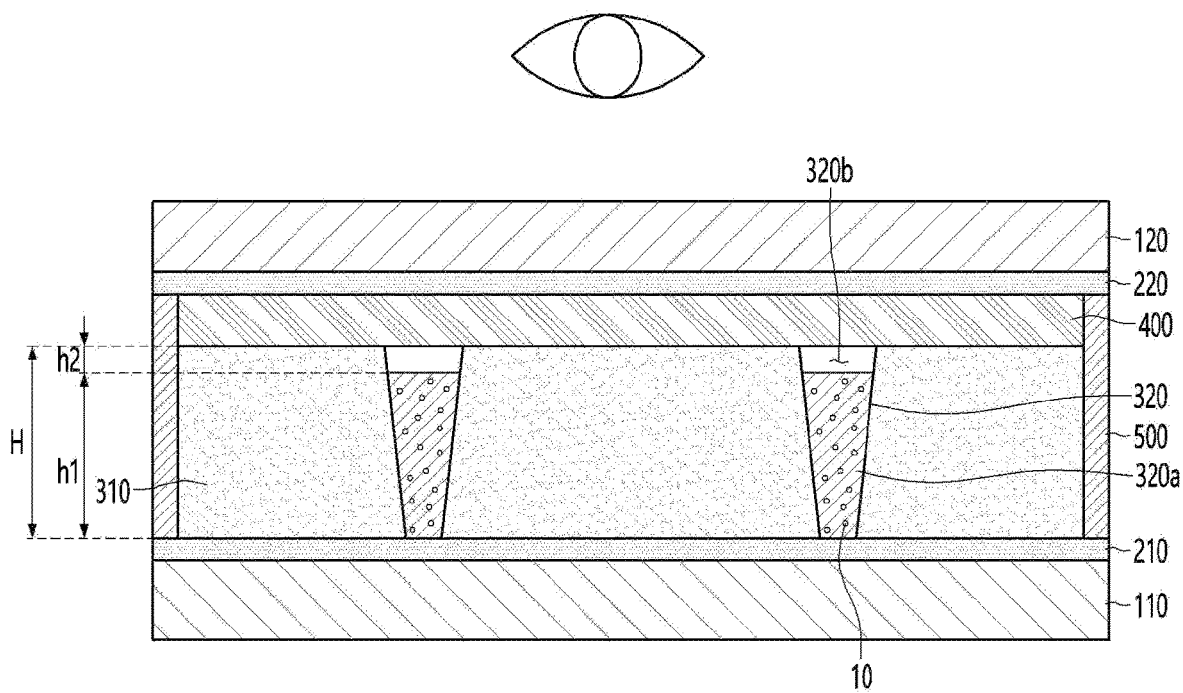
FIGS. 18 and 19 are a cross-sectional view taken along line B-B' of FIG. 15.
Figure 19:
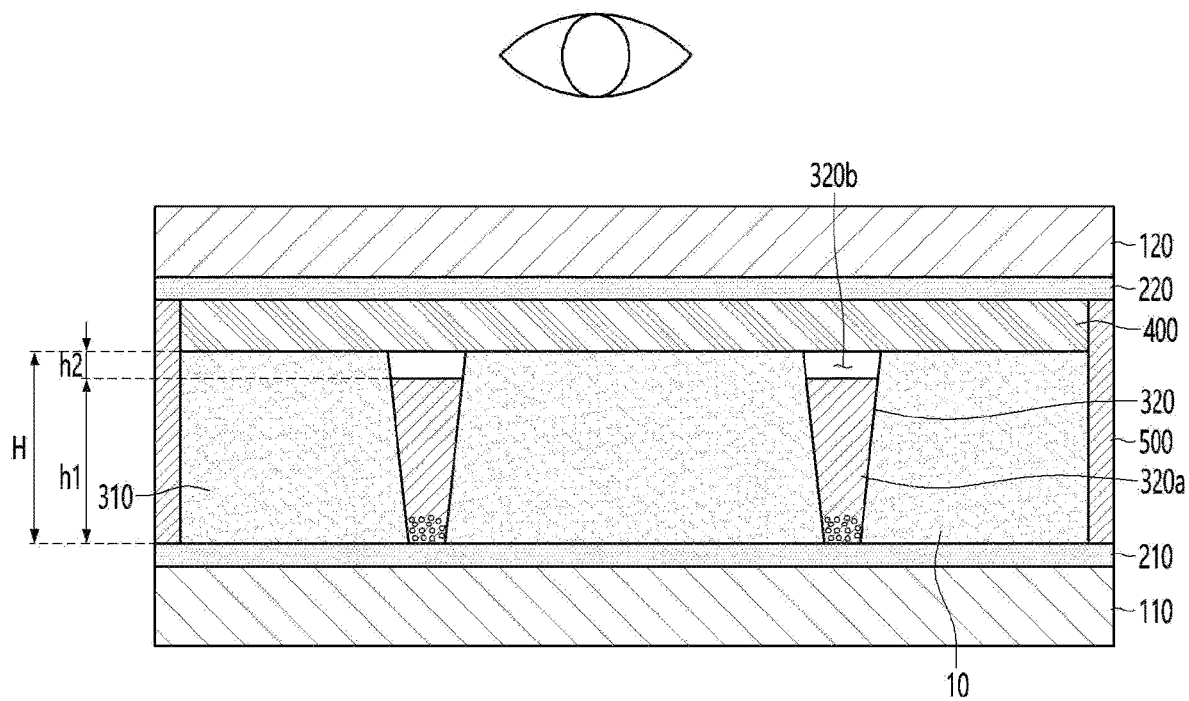

FIGS. 16 and 17 are a cross-sectional view taken along line A-A' of FIG. 15, and FIGS. 18 and 19 are a cross-sectional view taken along line B-B' of FIG. 15.

The adhesive layer 400 may be disposed in at least one of the area between the light conversion part 300 and the first substrate 110 or the area between the light conversion part 300 and the second substrate 120, the first substrate 110, the second substrate 120, and the light conversion part 300 may be adhered to each other by the adhesive layer 400.

Referring to FIGS. 16 to 19, the dispersion 320a may be partially disposed inside the receiving part 320. In detail, the height of the dispersion 320a may be smaller than the height of the receiving part 320. That is, the dispersion 320a and the air layer 320b region in which the dispersion 320a is not disposed may be formed in the receiving part 320.

That is, the air layer 320b may be disposed between the dispersion and the adhesive layer in the plurality of unit receiving cells of the first receiving part and the plurality of unit receiving cells of the second receiving part to be described below.

The adhesive layer 400 adhering the light conversion part 300 may be adhered to the partition wall part 310. In detail, the adhesive layer 400 may adhere only to the partition wall part 310 without contacting the dispersion 320a. That is, since the dispersion 320a is disposed without completely filling the inside of the receiving part 310, the adhesive layer 400 may adhere only to the partition wall part 310 and not to the dispersion 320a.

Accordingly, adhesion between the light conversion part and the first and second substrates may be improved. That is, it is possible to inhibit the adhesive layer that bonds the light conversion part and the first and second substrates from adhering to the dispersion before curing. That is, when the adhesive layer is in contact with the dispersion before curing, a reaction between the adhesive material and the dispersion prior to curing may occur or the adhesive material may be dissolved in the dispersion. Thereby, the adhesive properties of the adhesive layer after curing may be reduced. Since the light route control member according to the embodiment inhibits contact between the adhesive layer and the dispersion, it is possible to inhibit a decrease in the adhesive strength of the adhesive layer due to the contact between the adhesive material and the dispersion before curing.

In addition, the light route control member according to the embodiment may inhibit the dispersion from overflowing to the outside in the process of disposing the adhesive layer. That is, it is possible to inhibit the dispersion inside the receiving part from overflowing to the outside of the receiving part, that is, the partition wall part by the pressure generated when the adhesive layer is formed. That is, since the height of the dispersion is lower than the height of the receiving part, it is possible to inhibit the dispersion overflowing due to the formation of the adhesive layer, thereby inhibiting the partition wall part from being visually recognized by the user as a stain.

Accordingly, the light route controlling member according to the embodiment may improve the adhesive properties of the adhesive layer, thereby improving the reliability of the light route controlling member. In addition, it is possible to inhibit a decrease in visibility due to stains by inhibiting overflow characteristics of the dispersion.

The ratio of the dispersion 320a and the air layer 320b in the receiving part 320 may be controlled within a certain range. In detail, the height h1 of the dispersion 320a and the height h2 of the air layer 320b may be different from each other. In more detail, the height h1 of the dispersion 320a may be greater than the height h2 of the air layer 320b.

For example, the height h2 of the air layer 320b may be formed to be 2% to 20% of the height H of the receiving part 320. When the height h2 of the air layer 320b is less than 2%, that is, when the height h1 of the dispersion 320a is 98% or more, when the adhesive layer is disposed on the light conversion part, the adhesive material and the dispersion are contacted by pressure, thereby reducing adhesive properties of the adhesive layer. In addition, when the height h2 of the air layer 320b exceeds 20%, that is, when the height h1 of the dispersion 320a is 80% or less, when the light route control member is attached to the display device and used upright, due to an increase in the height of the air layer, a stain may be recognized by a user and visibility may be reduced, and frontal luminance may be reduced due to a change in refractive index in the air layer.

In addition, the size of the receiving part 320 may be controlled within a certain range. In detail, the first width w1, the second width w2, and the height H of the receiving part 320 may be controlled within a predetermined range.

The first width w1 of the receiving part may be defined as a short width of the receiving part. The first width w1 may be 5 μm or more. In detail, the first width w1 may be 5 μm to 50 μm. When the first width w1 is less than 5 μm, when the receiving part acts as a light shield, the viewing angle is widened, so it is difficult to realize a desired viewing angle. In addition, when the first width w1 exceeds 50 μm, the pattern of the receiving part may be visually recognized by a user, and thus visibility may be reduced.

The second width w2 of the receiving part may be defined as a long width of the receiving part. The second width w2 may be greater than the first width w1. The second width w2 may have a size of 3 to 20 times the size of the first width w1. For example, the second width w2 may be 15 μm to 1000 μm.

When the second width w2 is less than three times the size of the first width w1, when the receiving part acts as a light shield, the viewing angle is narrowed, so that it is difficult to realize a desired viewing angle. In addition, when the second width w2 exceeds the size of the first width w1 by 20 times, when the light route control member is attached to the display device and used in an upright manner, the height of the air layer is increased, so that the user perceives it as a stain, thereby reducing visibility.

The height H of the receiving part may be 50 μm to 300 μm. When the height (H) of the receiving part is less than 50 μm, since the viewing angle is narrow, it is difficult to realize a desired viewing angle. In addition, when the height (H) of the receiving part exceeds 300 μm, the moving speed of the light absorbing particles may decrease due to an increase in the distance of the moving particles in the dispersion, and accordingly, the driving characteristics of the light route controlling member may be reduced.

In addition, although not shown in the drawings, a sealing layer may be disposed on the receiving part 320. In detail, a sealing layer for sealing the dispersion from the outside may be disposed on the receiving part 320. When the sealing layer is further disposed, the sealing layer may be disposed between the air layer and the dispersion.

As described above, in the light route control member according to another embodiment, the dispersion disposed inside the receiving part may be disposed to be lower than the height of the receiving part. Accordingly, when bonding the light conversion part and the substrate through the adhesive layer, it is possible to inhibit the adhesive material from coming into contact with the dispersion of the light conversion part. Accordingly, the light route control member according to the embodiment may inhibit the adhesive properties of the adhesive layer from being reduced due to the contact between the adhesive material and the dispersion, and thus may have improved reliability.

In addition, when disposing the adhesive layer, it is possible to inhibit the dispersion from overflowing to the outside, that is, to the partition wall part due to the pressure caused by the bonding process. Accordingly, the light route control member according to the embodiment may inhibit staining due to overflow of the dispersion, and thus may have improved visibility.

Meanwhile, the receiving part 320 may be disposed in various arrangements.

Referring to FIG. 15, the receiving part 320 may include a plurality of receiving parts 321.

The receiving parts may be disposed to be spaced apart from each other in a column direction. For example, the receiving part 321 may include first receiving parts 321a disposed in the first column 1A and second receiving parts 321b disposed in the second column 2A.

The first receiving parts 321a disposed in the first column may be disposed to be spaced apart from each other, and the second receiving parts 321b disposed in the second column may also be disposed to be spaced apart from each other.

In detail, the first receiving part 321a includes a plurality of unit receiving cells spaced apart from each other in the first column direction, and the second receiving part 321b may include a plurality of unit receiving cells spaced apart from each other in the second column direction.

The first receiving part 321a may include an overlapping area OA overlapping the second receiving part 321b in a direction perpendicular to the first column direction and the second column direction. And, the first receiving part 321a may include a non-overlapping area NOA that does not overlap the second receiving part 321b in a direction perpendicular to the first column direction and the second column direction.

In detail, the first receiving part 321a may include an overlapping area OA overlapping the second receiving part 321b disposed adjacent to the first receiving part 321a in a row direction and a non-overlapping area NOA that does not overlap in a row direction. That is, the first receiving parts 321a of the first column and the second receiving parts 321b of the second column may be disposed to be partially shifted from each other in the row direction.

Accordingly, the visibility of the light route control member can be improved. That is, when the light route control member is used in an upright manner in a device such as a notebook computer, an area in which the air layer is formed may be visually recognized by the user. At this time, by disposing the first receiving parts 321a of the first column and the second receiving parts 321b of the second column to be partially shifted from each other in the row direction, in each of the patterns, it is possible to inhibit the stains according to the area where the air layer is formed from being visually recognized in a linear shape.

Accordingly, when the user sees, it is possible to minimize the recognition of such a stain, so that the visibility of the light route control member can be improved.

Figure 20:
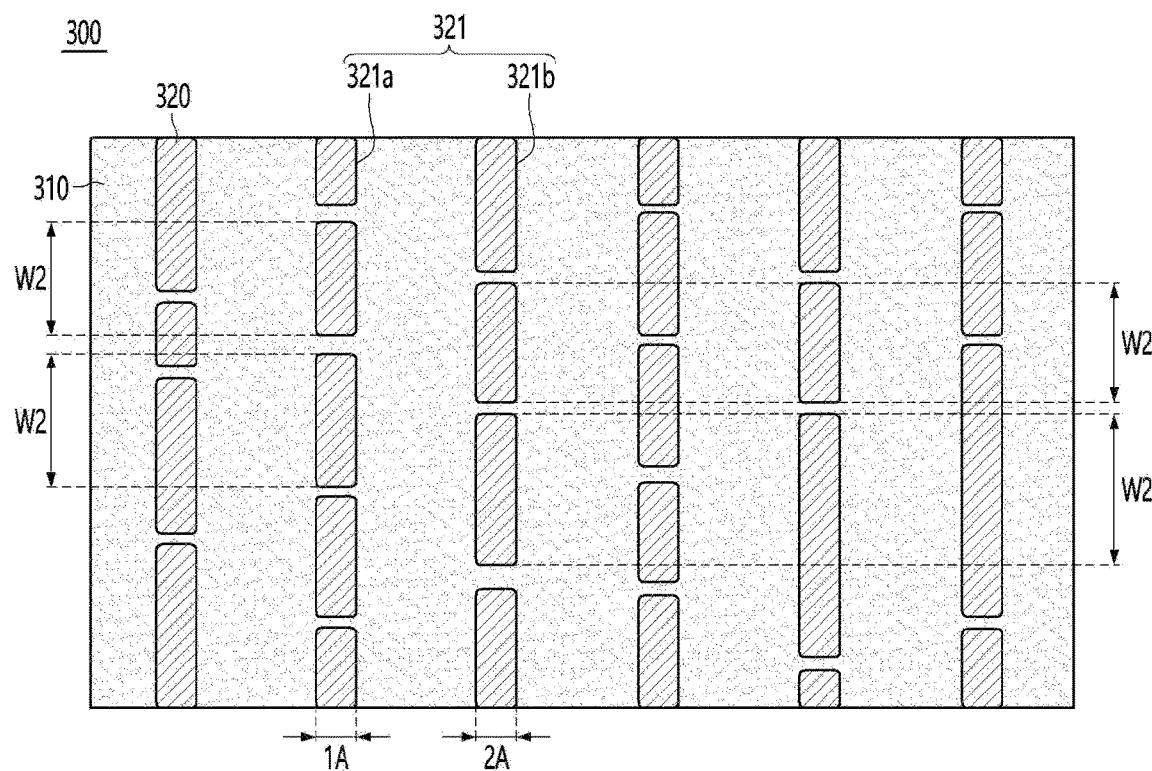
FIGS. 20 to 21 are views showing another top view of a light conversion part of a light route control member according to an embodiment.

Also, referring to FIG. 20, the receiving parts may be formed in different sizes. In detail, the receiving parts may be formed to have different second widths w2.

The receiving parts may be disposed to be spaced apart from each other in a column direction. For example, the receiving parts 321 may include first receiving parts 321a disposed in the first column 1A and second receiving parts 321b disposed in the second column 2A.

The plurality of unit receiving cells of the first receiving part 321a disposed in the first column may be disposed to be spaced apart from each other, and a plurality of unit receiving cells of the second receiving part 321b disposed in the second column may also be disposed to be spaced apart from each other.

The plurality of unit receiving cells of the first receiving part 321a may have different sizes, that is, different second widths w2. Also, the plurality of unit receiving cells of the second receiving part 321b may have different second widths w2.

In addition, the width of the plurality of unit receiving cells of the first receiving part 321a and the width of the plurality of unit receiving cells of the second receiving part 321b may be the same or different.

Accordingly, the visibility of the light route control member can be improved. That is, when the light route control member is used in an upright manner in a device such as a notebook computer, an area in which the air layer is formed may be visually recognized by the user. At this time, by forming the first receiving parts 321a in the first column and the second receiving parts 321b in the second column to have different sizes, in each of the patterns, it is possible to inhibit the stains according to the area where the air layer is formed from being visually recognized in a linear shape.

Accordingly, when the user sees, it is possible to minimize the recognition of such a stain, so that the visibility of the light route control member can be improved.

In addition, when the light route control member is used by being attached to a display panel, it is possible to inhibit a moire formed by overlapping with a pixel pattern included in the display panel. That is, by randomly forming the sizes of the receiving parts of the light route control member, a moire that may occur when the receiving parts and the pixel pattern overlap may be minimized. Accordingly, the visibility of the light route control member may be improved by minimizing the moire.

Figure 21:
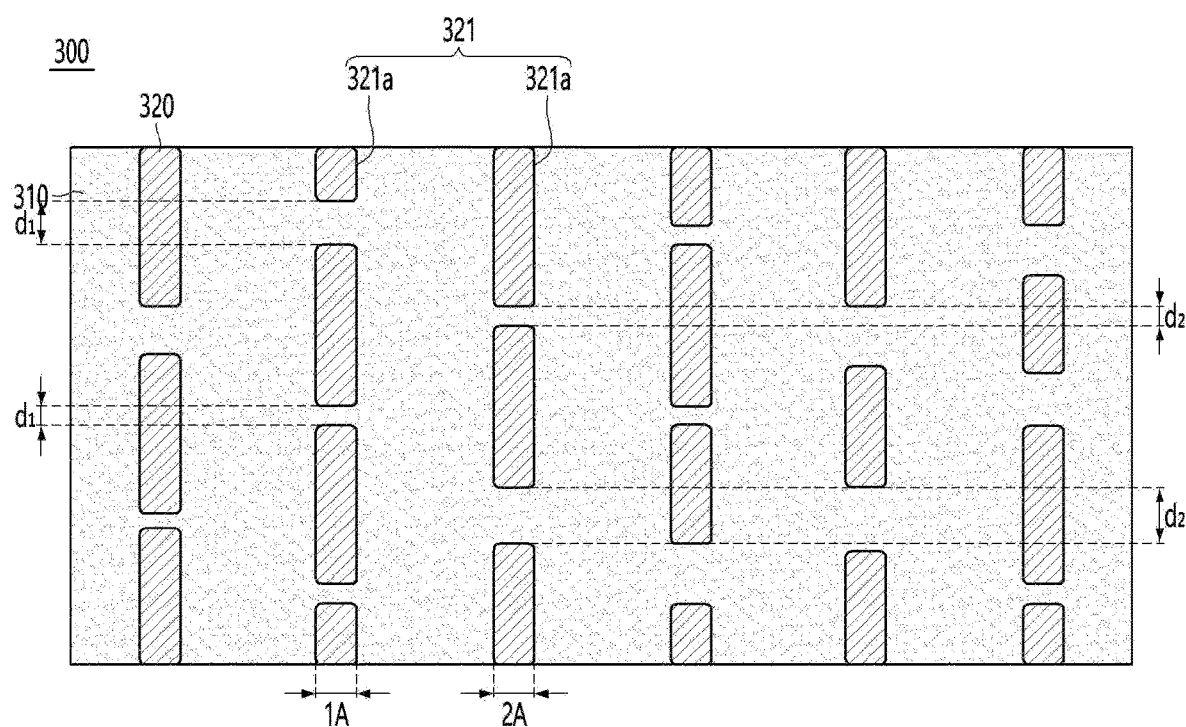

Also, referring to FIG. 21, the spaced distances of the receiving parts may be spaced apart from each other by different sizes.

The receiving parts may be disposed to be spaced apart from each other in a column direction. For example, the receiving parts 321 may include a plurality of unit receiving cells of the first receiving part 321a disposed in the first column 1A, and a plurality of unit receiving cells of the second receiving part 321b disposed in the second column 1A.

The plurality of unit receiving cells of the first receiving part 321a disposed in the first column may be disposed to be spaced apart from each other, and the plurality of unit receiving cells of the second receiving part 321b disposed in the second column may also be disposed to be spaced apart from each other.

The separation distance d1 of the plurality of unit receiving cells of the first receiving part 321a may be different from the separation distance d2 of the plurality of unit receiving cells of the second receiving part 321b. In addition, in the first column, the separation distance d1 of each of the plurality of unit receiving cells of the first receiving part 321a may be different from each other.

Accordingly, the visibility of the light route control member can be improved. That is, when the light route control member is used in an upright manner in a device such as a notebook computer, an area in which the air layer is formed may be visually recognized by the user. At this time, the separation distance d1 of the plurality of unit receiving cells of the first receiving part 321a and the separation distance d2 of the plurality of unit receiving cells of the second receiving part 321b are different from each other, or by differentiating the respective separation distances of the plurality of unit receiving cells of the first and second receiving units in the first and second columns, it is possible to inhibit the stains according to the area where the air layer is formed in each of the receiving units from being visually recognized in a linear shape.

Accordingly, when the user sees, it is possible to minimize the recognition of such a stain, so that the visibility of the light route control member can be improved.

In addition, when the light route control member is used by being attached to a display panel, it is possible to inhibit a moire formed by overlapping with a pixel pattern included in the display panel. That is, by randomly forming the separation distance between the receiving parts of the light route control member, a moire that may occur when the receiving parts and the pixel pattern overlap may be minimized. Accordingly, the visibility of the light route control member may be improved by minimizing the moire.

Hereinafter, referring to FIGS. 22 to 24, a display device and a display apparatus to which a light route control member according to an embodiment is applied will be described.

Figure 22:
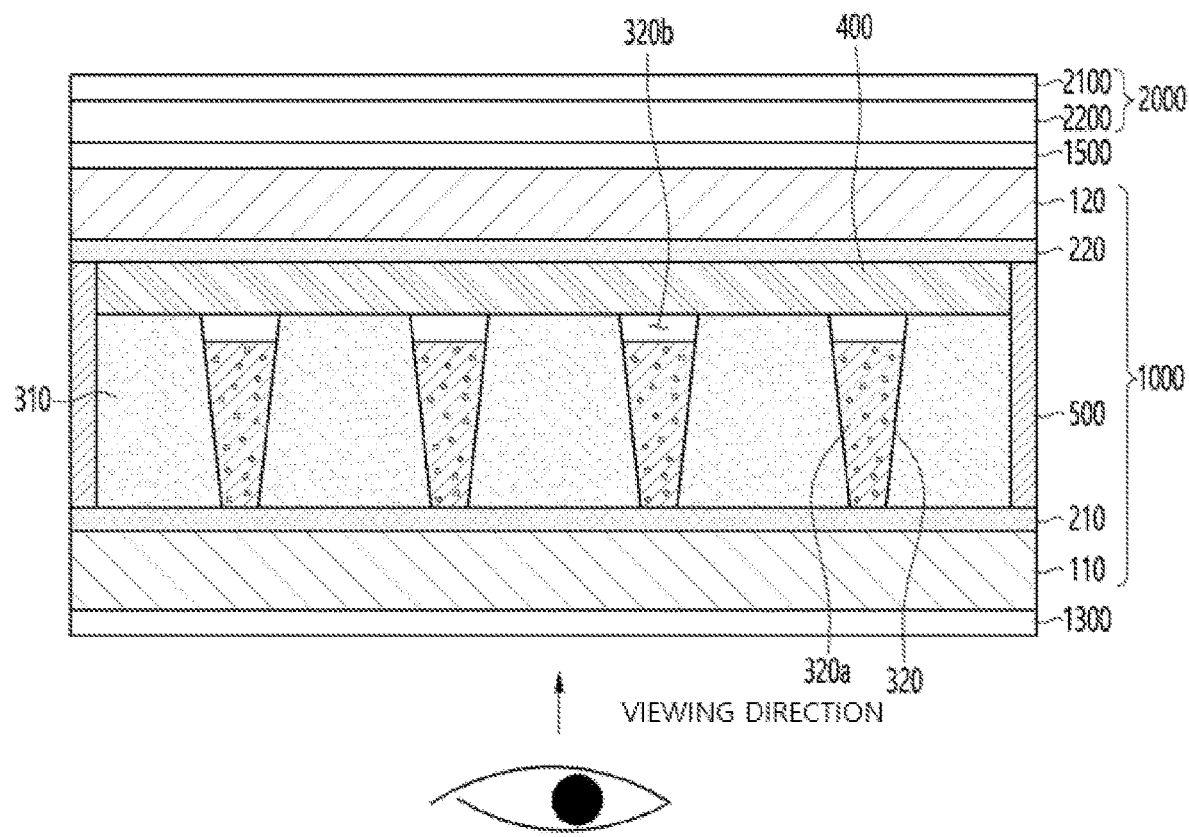
FIG. 22 is a cross-sectional view of a display device to which a light route control member according to an embodiment is applied.

Referring to FIG. 22, a light route control member 1000 according to an embodiment may be disposed on a display panel 2000.

The display panel 2000 and the light route control member 1000 may be disposed to be adhered to each other. For example, the display panel 2000 and the light route control member 1000 may be adhered to each other via an adhesive layer 1500. The adhesive layer 1500 may be transparent. For example, the adhesive layer 1500 may include an adhesive or an adhesive layer containing an optical transparent adhesive material.

The adhesive layer 1500 may include a release film. In detail, when adhering the light route control member and the display panel, the light route control member and the display panel may be adhered after the release film is removed.

The display panel 2000 may include a first substrate 2100 and a second substrate 2200. When the display panel 2000 is a liquid crystal display panel, the light route control member may be formed under the liquid crystal panel. That is, when the user-viewed side of the liquid crystal panel is defined as the upper portion of the liquid crystal panel, the light route control member may be disposed below the liquid crystal panel. The display panel 2000 may be formed in a structure in which the first substrate 2100 including a thin film transistor (TFT) and a pixel electrode and the second substrate 2200 including color filter layers are bonded with a liquid crystal layer interposed therebetween.

In addition, the display panel 2000 may be a liquid crystal display panel of a color filter on transistor (COT) structure in which a thin film transistor, a color filter, and a black matrix are formed at the first substrate 2100 and the second substrate 2200 is bonded to the first substrate 2100 with the liquid crystal layer interposed therebetween. That is, a thin film transistor may be formed on the first substrate 2100, a protective film may be formed on the thin film transistor, and a color filter layer may be formed on the protective film. In addition, a pixel electrode in contact with the thin film transistor may be formed on the first substrate 2100. At this point, in order to improve an aperture ratio and simplify a masking process, the black matrix may be omitted, and a common electrode may be formed to function as the black matrix.

In addition, when the display panel 2000 is the liquid crystal display panel, the display device may further include a backlight unit providing light from a rear surface of the display panel 2000. The backlight unit may be disposed under the light route control member.

That is, as shown in FIG. 22, the light route control member may be disposed under the liquid crystal panel.

Alternatively, when the display panel 2000 is an organic light emitting display panel, the light route control member may be formed on the organic light emitting display panel. That is, when the surface viewed by the user of the organic light emitting display panel is defined as the upper portion of the organic light emitting display panel, the light route control member may be disposed on the organic light emitting display panel. The display panel 2000 may include a self-luminous element that does not require a separate light source. In the display panel 2000, a thin film transistor may be formed on the first substrate 2100, and an organic light emitting element in contact with the thin film transistor may be formed. The organic light emitting element may include an anode, a cathode, and an organic light emitting layer formed between the anode and the cathode. Further, the second substrate 2200 configured to function as an encapsulation substrate for encapsulation may further be included on the organic light emitting element.

Furthermore, although not shown in drawings, a polarizing plate may be further disposed between the light route control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting display panel, the polarizing plate may be the external light reflection preventive polarizing plate.

In addition, an additional functional layer 1300 such as an anti-reflection layer, an anti-glare, or the like may be further disposed on the light route control member 1000. Specifically, the functional layer 1300 may be adhered to one surface of the substrate of the light route control member. Although not shown in drawings, the functional layer 1300 may be adhered to the base 100 of the light route control member via an adhesive layer. In addition, a release film for protecting the functional layer may be further disposed on the functional layer 1300.

Further, a touch panel may be further disposed between the display panel and the light route control member.

Although it is shown in the drawings that the light route control member is disposed at an upper portion of the display panel, but the embodiment is not limited thereto, and the light route control member may be disposed at various positions such as a position in which light is adjustable, that is, a lower portion of the display panel, between a second substrate and a first substrate of the display panel, or the like.

Referring to FIGS. 23 and 24, the light route control member according to the embodiment may be applied to a vehicle.

Referring to FIGS. 23 and 24, the light route control member according to the embodiment may be applied to a display device that displays a display.

For example, when power is not applied to the light route control member as shown in FIG. 23, the receiving part functions as the light blocking part, so that the display device is driven in a light blocking mode, and when power is applied to the light route control member as shown in FIG. 24, the receiving part functions as the light transmitting part, so that the display device may be driven in an open mode.

Accordingly, a user may easily drive the display device in a privacy mode or a normal mode according to application of power.

In addition, although not shown in the drawings, the display device to which the light route control member according to the embodiment is applied may also be applied inside the vehicle.

For example, the display device including the light route control member according to the embodiment may display a video confirming information of the vehicle and a movement route of the vehicle. The display device may be disposed between a driver seat and a passenger seat of the vehicle.

In addition, the light route control member according to the embodiment may be applied to a dashboard that displays a speed, an engine, an alarm signal, and the like of the vehicle.

Furthermore, the light route control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A light route control member comprising:
   a first substrate;
   a first electrode disposed on an upper surface of the first substrate;
   a second substrate disposed on the first substrate;
   a second electrode disposed on a lower surface of the second substrate; and
   a light conversion part disposed between the first electrode and the second electrode, and defining a first direction and a second direction,
   wherein the light conversion part includes a partition wall part and a receiving part that are alternately disposed,
   wherein the receiving part includes a plurality of cells spaced apart from each other in the second direction,
   wherein at least one of the cells includes a first inner surface and a second inner surface connected to each other,
   wherein at least one inner surface of the first inner surface and the second inner surface extends in a direction different from the first direction and the second direction,
   wherein the first inner surface and the second inner surface are inclined at an angle of 35 degrees to 55 degrees or 125 degrees to 145 degrees.

2. The light route control member of claim 1, wherein the receiving part includes at least one separation part disposed between cells adjacent in the second direction.

3. The light route control member of claim 2, wherein the length of the separation part is 0.5 times or less the width of the cell.

4. The light route control member of claim 2, wherein the separation part and the partition wall part are integrally formed.

5. The light route control member of claim 2, wherein the receiving parts include a first receiving part and a second receiving part spaced apart from each other in the first direction,
wherein a length of the separation part is smaller than a pitch of the first receiving part and the second receiving part.

6. The light route control member of claim 5, wherein the separation part includes a first separation part and a second separation part,
wherein the first separation part and the second separation part are formed to have different lengths.

7. The light route control member of claim 2, wherein the receiving part includes a first receiving part and a second receiving part spaced apart from the first receiving part through the partition wall part,
wherein the first receiving part includes a first separation part,
wherein the second receiving part includes a second separation part, and
wherein the first separation part and the second separation part do not overlap in the first direction.

8. The light route control member of claim 1, wherein the first inner surface or the second inner surface extends in a direction corresponding to the first direction or the second direction.

9. The light route control member of claim 1, wherein the length of the cells is 50 μm to 150 μm.

10. The light route control member of claim 1, wherein the receiving part includes a dispersion and light conversion particles dispersed in the dispersion,
wherein at least one of the first direction and the second direction is defined as a direction in which the dispersion is filled.

11. The light route control member of claim 1, wherein the first inner surface extends in a direction different from the first direction,
wherein the second inner surface extends in a direction corresponding to the second direction.

12. The light route control member of claim 1, wherein the at least one cell is formed in a trapezoidal shape.

13. The light route control member of claim 1, wherein a dispersion in which light conversion particles are dispersed is disposed inside the receiving part,
wherein a height of the dispersion is smaller than a height of the receiving part.

14. The light route control member of claim 13, comprising an adhesive layer disposed between the light conversion part and the second electrode,
wherein an air layer is formed between the receiving part and the adhesive layer.

15. The light route control member of claim 14, wherein a height of the air layer is formed to a height of 2% to 20% with respect to the height of the receiving part.

16. The light route control member of claim 1, wherein a first width defined as the short width of the cell is 5 μm to 50 μm,
wherein a second width defined as the long width of the cell is 15 μm to 1000 μm,
wherein a height of the cell is 50 μm to 300 μm.

17. The light route control member of claim 1, wherein the receiving part includes a first receiving part disposed in a first column and a second receiving part disposed in a second column,
wherein the first receiving part includes an overlapping region overlapping the second receiving part in a direction perpendicular to the first column direction and the second column direction; and a non-overlapping region that does not overlap the second receiving part in a direction perpendicular to the first column direction and the second column direction.

18. The light route control member of claim 1, wherein the receiving part includes a first receiving part disposed in a first column and a second receiving part disposed in a second column,
wherein sizes of the plurality of cells of the first receiving part are different from each other, and
wherein sizes of the plurality of cells of the second receiving part are different from each other.

19. The light route control member of claim 1, wherein the receiving part includes a first receiving part disposed in a first column and a second receiving part disposed in a second column,
wherein a separation distance between the plurality of cells of the first receiving part is different from a separation distance between the plurality of cells of the second receiving part.

20. A display device comprising;
a display panel; and
a light route control member disposed on the display panel;
wherein the light route control member comprises;
a first substrate;
a first electrode disposed on an upper surface of the first substrate;
a second substrate disposed on the first substrate;
a second electrode disposed on a lower surface of the second substrate; and
a light conversion part disposed between the first electrode and the second electrode, and defining a first direction and a second direction,
wherein the light conversion part includes a partition wall part and a receiving part that are alternately disposed,
wherein the receiving part includes a plurality of cells spaced apart from each other in the second direction,
wherein at least one of the cells includes a first inner surface and a second inner surface connected to each other,
wherein at least one inner surface of the first inner surface and the second inner surface extends in a direction different from the first direction and the second direction,
wherein the first inner surface and the second inner surface are inclined at an angle of 35 degrees to 55 degrees or 125 degrees to 145 degrees.

* * * * *